(12) United States Patent
Onoya

(10) Patent No.: US 9,933,806 B2
(45) Date of Patent: Apr. 3, 2018

(54) SEMICONDUCTOR DEVICE AND ELECTRONIC DEVICE

(71) Applicant: Semiconductor Energy Laboratory Co., Ltd., Atusgi-shi, Kanagawa-ken (JP)

(72) Inventor: Shigeru Onoya, Isehara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 15/419,500

(22) Filed: Jan. 30, 2017

(65) Prior Publication Data
US 2017/0235325 A1 Aug. 17, 2017

(30) Foreign Application Priority Data
Feb. 12, 2016 (JP) ................. 2016-024925

(51) Int. Cl.
*G05F 3/08* (2006.01)
*H01L 23/64* (2006.01)
*H01L 27/092* (2006.01)
*H01L 27/12* (2006.01)
*H01L 29/786* (2006.01)

(52) U.S. Cl.
CPC .............. *G05F 3/08* (2013.01); *H01L 23/645* (2013.01); *H01L 27/092* (2013.01); *H01L 27/124* (2013.01); *H01L 27/1207* (2013.01); *H01L 27/1225* (2013.01); *H01L 27/1255* (2013.01); *H01L 29/7869* (2013.01)

(58) Field of Classification Search
CPC ... G05F 1/40; G05F 1/44; G05F 1/563; G05F 3/08; G05F 3/10; G05F 3/16; G05F 3/185; G05F 3/20; G05F 3/24

USPC ......................... 323/265, 311–314, 318, 349
See application file for complete search history.

(56) References Cited

U.S. PATENT DOCUMENTS

| | | | | |
|---|---|---|---|---|
| 3,586,880 A | * | 6/1971 | Fitzwater, Jr. | ....... G11C 27/026 327/384 |
| 5,872,469 A | | 2/1999 | Nestler | |
| 6,037,832 A | * | 3/2000 | Kaminishi | .............. H01S 5/042 323/312 |
| 6,127,702 A | | 10/2000 | Yamazaki et al. | |
| 6,963,323 B2 | | 11/2005 | Sakurai et al. | |
| 7,176,742 B2 | | 2/2007 | Aksin et al. | |
| 9,378,844 B2 | | 6/2016 | Takahashi | |

(Continued)

FOREIGN PATENT DOCUMENTS

| | | |
|---|---|---|
| JP | 08-123584 A | 5/1996 |
| JP | 2002-351417 A | 12/2002 |

*Primary Examiner* — Adolf Berhane
(74) *Attorney, Agent, or Firm* — Robinson Intellectual Property Law Office; Eric J. Robinson

(57) ABSTRACT

A semiconductor device which controls output of a plurality of voltages is provided. A power supply control circuit which drives the semiconductor device includes a reference voltage generating circuit and a stabilized power supply circuit. The stabilized power supply circuit has a function of outputting a voltage input from a sample-and-hold circuit and amplified by the amplifier circuit. A control circuit has a function of setting an output voltage of the power supply control circuit. The sample-and-hold circuit in the stabilized power supply circuit includes a transistor whose on/off state is controlled. In such a configuration, a voltage set by the control circuit can be held and output.

14 Claims, 28 Drawing Sheets

(56) References Cited

U.S. PATENT DOCUMENTS

| | | | |
|---|---|---|---|
| 2002/0135402 A1* | 9/2002 | Miyabe | G11C 27/026 327/94 |
| 2007/0279031 A1* | 12/2007 | Takeyama | G05F 1/465 323/314 |
| 2010/0148171 A1 | 6/2010 | Hayashi et al. | |
| 2011/0084734 A1* | 4/2011 | Russell | H05B 33/0818 327/108 |
| 2011/0089417 A1 | 4/2011 | Yamazaki et al. | |
| 2011/0279148 A1* | 11/2011 | Watanabe | G11C 27/026 327/96 |
| 2012/0126892 A1* | 5/2012 | Rabary | G05F 3/08 330/127 |
| 2013/0181854 A1 | 7/2013 | Koyama et al. | |
| 2013/0271220 A1 | 10/2013 | Takahashi et al. | |
| 2013/0272055 A1 | 10/2013 | Yamamoto | |
| 2014/0132241 A1* | 5/2014 | Fukazawa | G05F 3/30 323/314 |
| 2015/0091618 A1* | 4/2015 | Min | G09G 3/3291 327/93 |
| 2015/0206598 A1* | 7/2015 | Enjalbert | G11C 27/024 324/658 |
| 2016/0094236 A1 | 3/2016 | Shionoiri et al. | |
| 2016/0105194 A1* | 4/2016 | Kumbaranthodiyil | H03M 1/1245 341/122 |
| 2017/0104480 A1* | 4/2017 | Eshel | H03K 5/1252 |

* cited by examiner

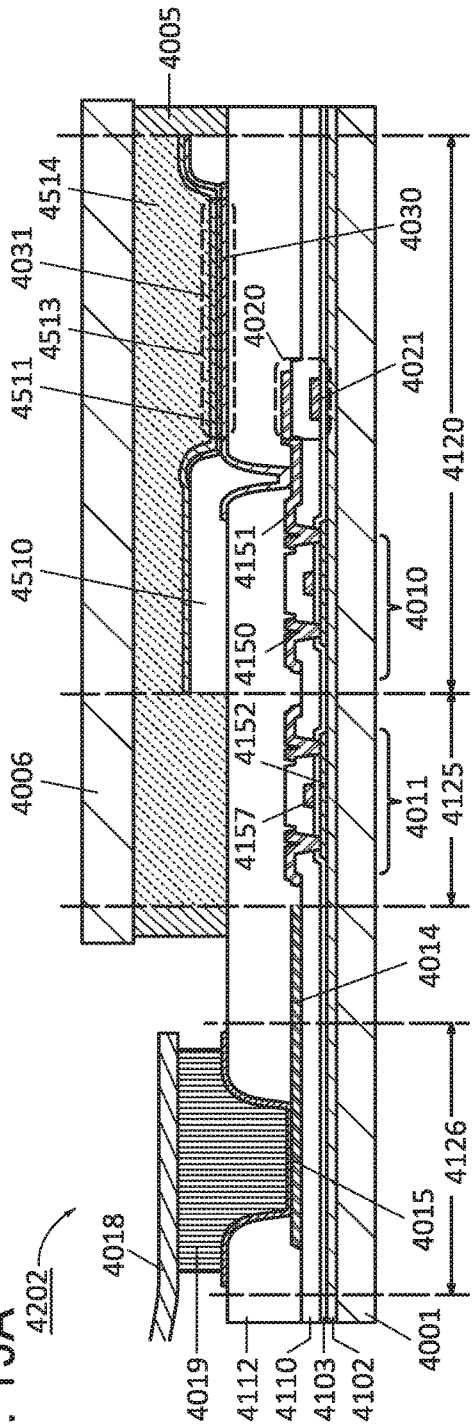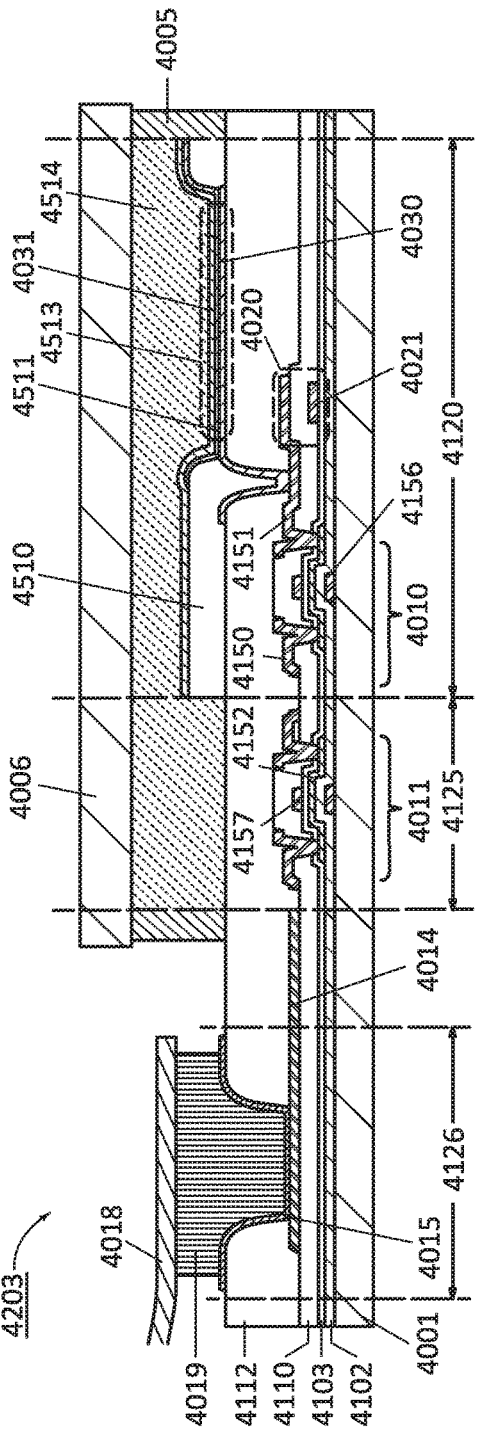

FIG. 17A
(ST71) element substrate is completed
(ST72) dicing
(ST73) die bonding
(ST74) wire bonding
(ST75) molding
(ST76) lead plating and shaping
(ST77) marking
(ST78) test
(ST79) completed
FIG. 17B
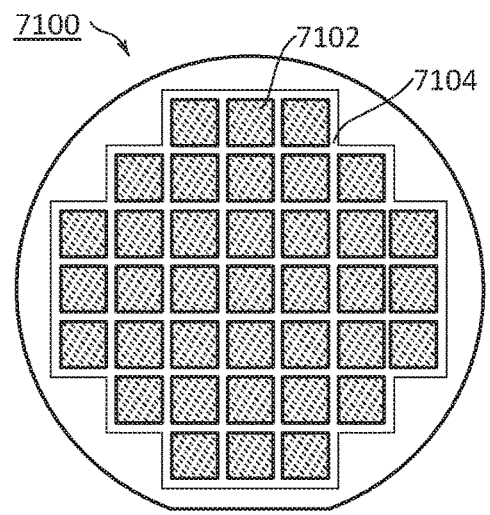
FIG. 17C
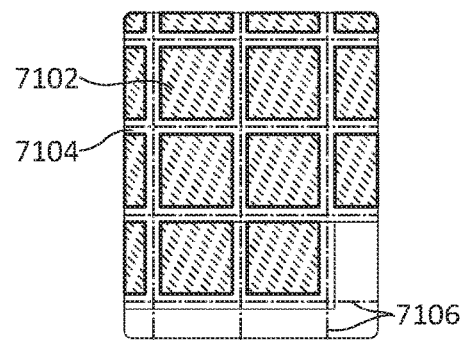
FIG. 17D
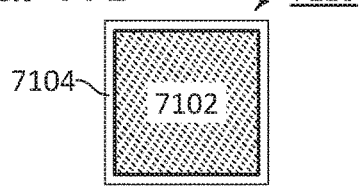
FIG. 17E
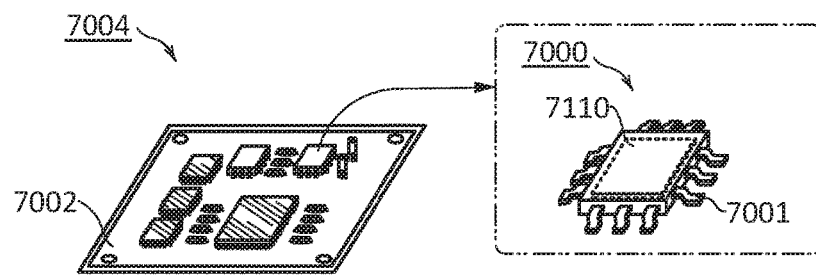

FIG. 20A
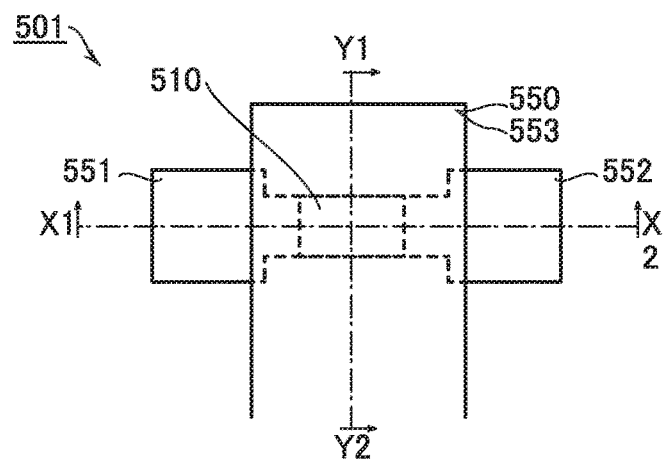
FIG. 20B
FIG. 20C
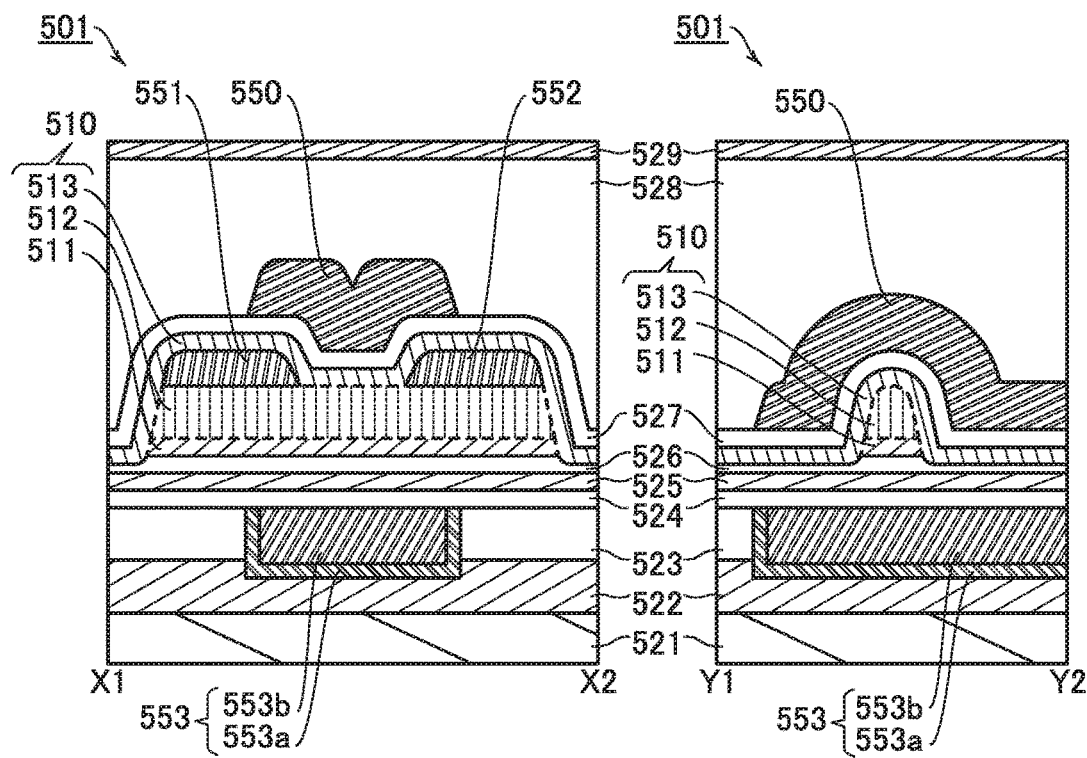

FIG. 23A
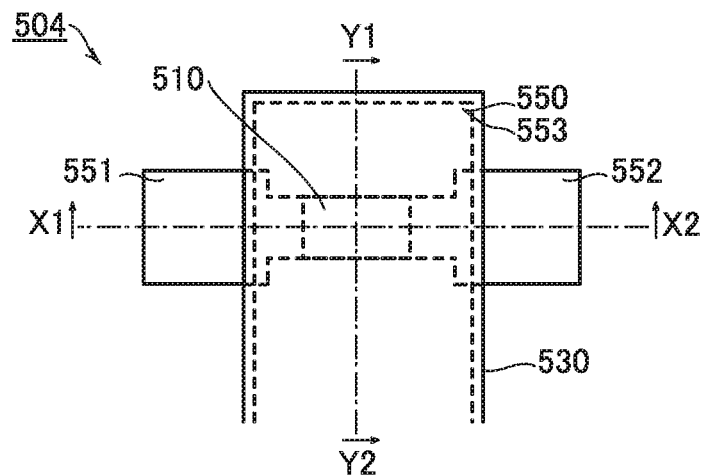
FIG. 23B
FIG. 23C
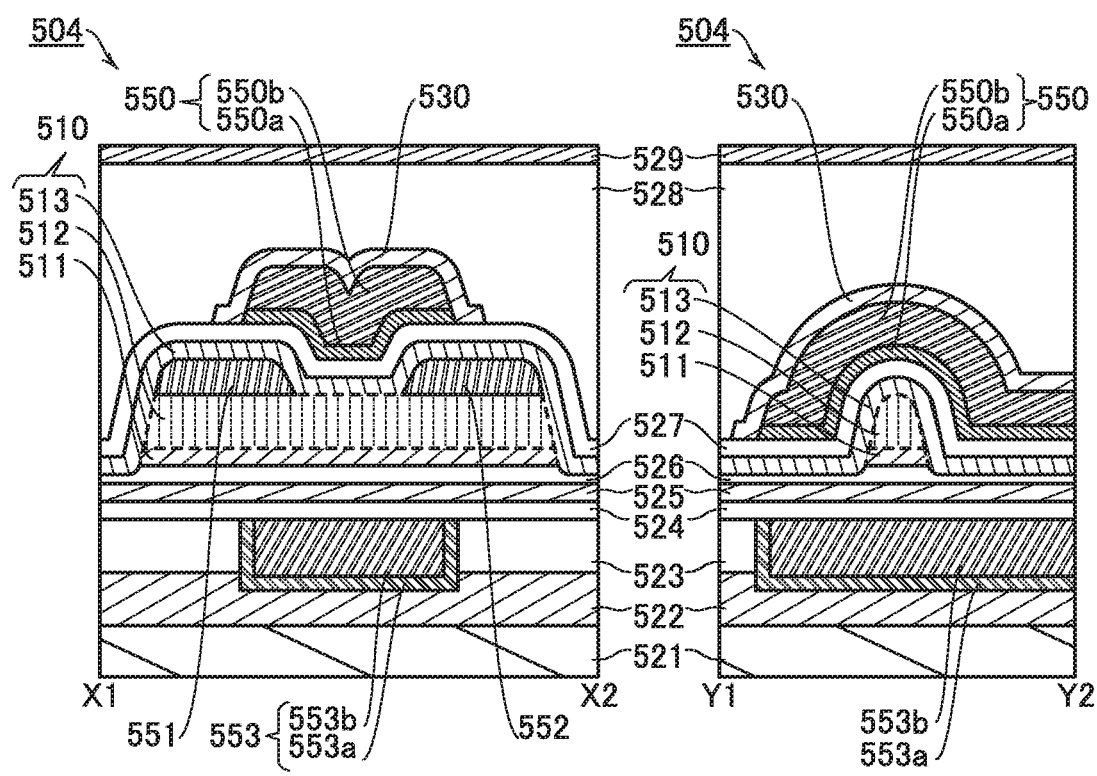

FIG. 24A
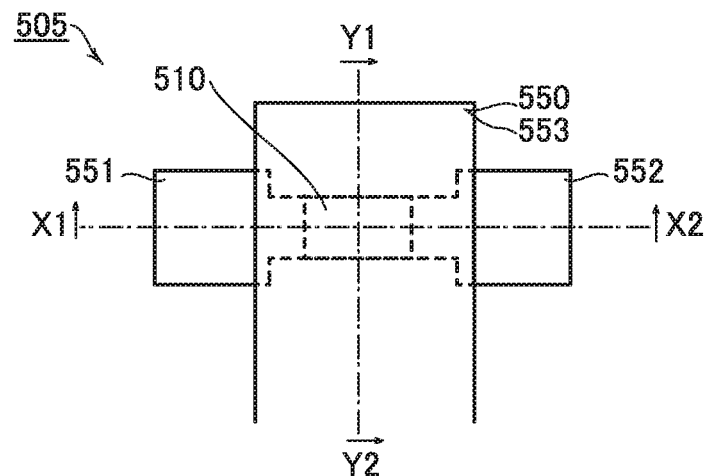
FIG. 24B
FIG. 24C
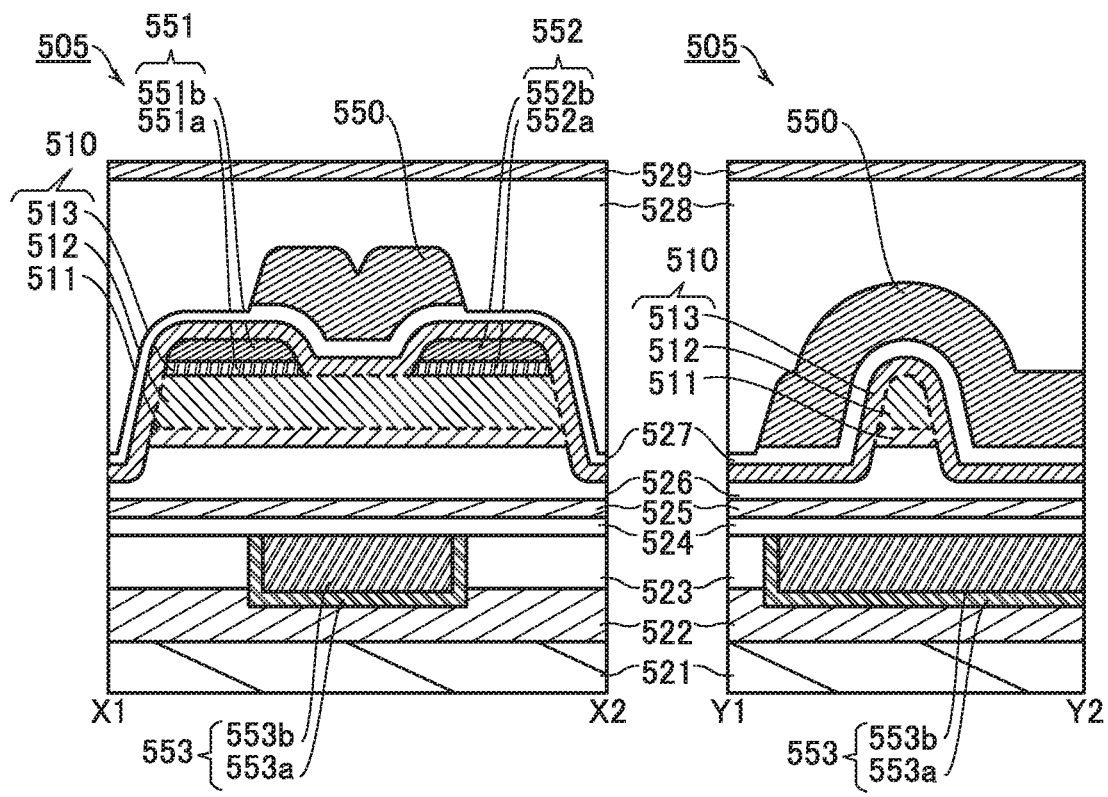

FIG. 25A
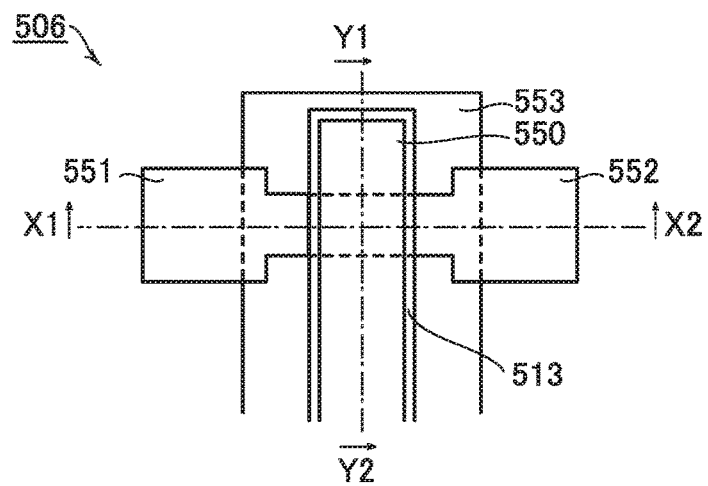
FIG. 25B                    FIG. 25C
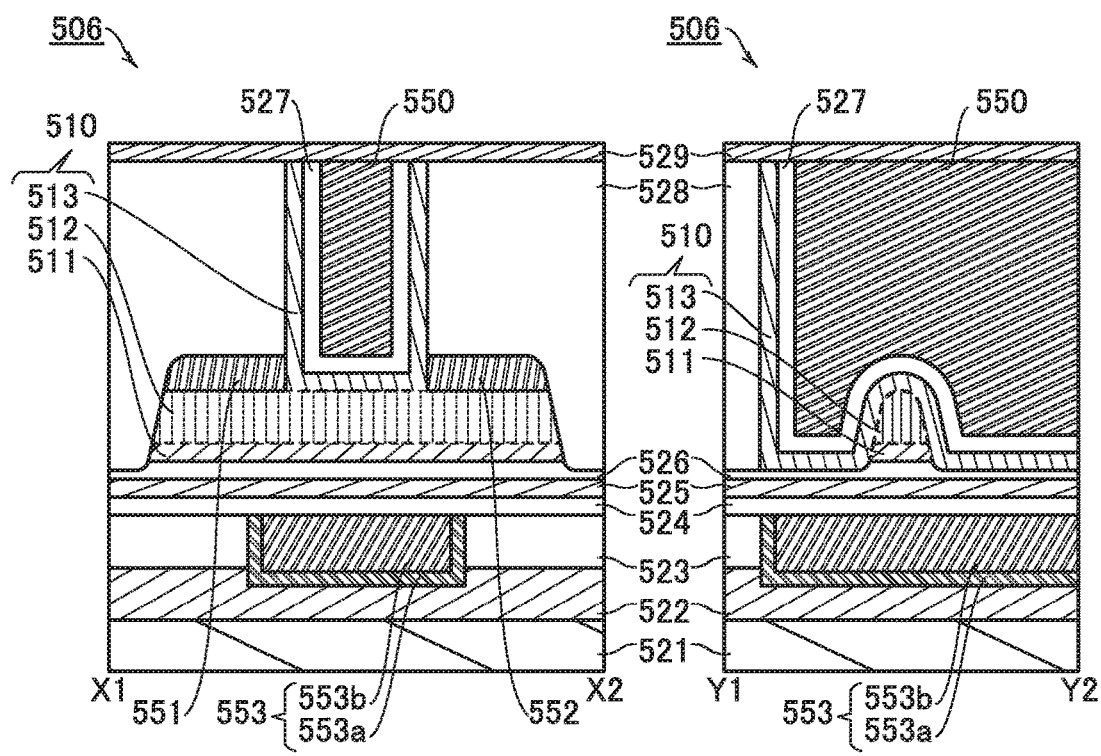

SEMICONDUCTOR DEVICE AND ELECTRONIC DEVICE

BACKGROUND OF THE INVENTION

1. Field of the Invention

One embodiment of the present invention relates to a semiconductor device and an electronic device.

Note that one embodiment of the present invention is not limited to the above technical field. The technical field of one embodiment of the invention disclosed in this specification and the like relates to an object, a method, or a manufacturing method. The present invention relates to a process, a machine, manufacture, or a composition of matter. In particular, one embodiment of the present invention relates to a semiconductor device, a display device, a light-emitting device, a power storage device, a storage device, a driving method thereof, or a manufacturing method thereof.

In this specification and the like, a semiconductor device means a device, a circuit, an element, and the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

2. Description of the Related Art

A semiconductor device serving as a power supply circuit outputs different power supply voltages. A power supply circuit which outputs a power supply voltage to an active matrix display device outputs different power supply voltages to a driver circuit for driving a data line and a driver circuit for controlling a scan line, for example.

In a power supply circuit in Patent Document 1, for example, voltages input from an analog multiplexer and a sample-and-hold circuit are calculated using a voltage arithmetic circuit, and input and output of applied voltage are controlled.

For example, a power supply circuit in Patent Document 2 supplies a voltage output from a direct current voltage conversion circuit and a voltage output from a stabilized power supply circuit to each driver circuit as a power supply voltage. As the stabilized power supply circuit, a switching regulator or a linear regulator is used.

REFERENCE

Patent Document

[Patent Document 1] Japanese Published Patent Application No. H08-123584
[Patent Document 2] Japanese Published Patent Application No. 2002-351417

SUMMARY OF THE INVENTION

The circuit area of a power supply circuit which outputs different power supply voltages is increased in accordance with an increase in the number of power supply voltages.

A linear regulator used as a stabilized power supply circuit has large power loss, and power consumption thereof is increased in accordance with an increase in the number of power supply voltages. A switching regulator used as a stabilized power supply circuit has a lot of noise because high-speed switching is required.

In view of the foregoing problems, an object of one embodiment of the present invention is to provide a semiconductor device and an electronic device each having a novel configuration. Another object of one embodiment of the present invention is to provide a semiconductor device and an electronic device each having a novel configuration in which an increase in a circuit area is inhibited. Another object of one embodiment of the present invention is to provide a semiconductor device and an electronic device each having a novel configuration in which power consumption can be reduced. Another object of one embodiment of the present invention is to provide a semiconductor device and an electronic device each having a novel configuration in which noise in a power supply circuit can be reduced.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

One embodiment of the present invention is a semiconductor device including a power supply control circuit and a control circuit. The power supply control circuit includes a reference voltage generating circuit and a stabilized power supply circuit. The stabilized power supply circuit includes a first sample-and-hold circuit and a first amplifier circuit. The reference voltage generating circuit has a function of generating a first voltage applied to the first amplifier circuit. The first sample-and-hold circuit is electrically connected to an input terminal of the first amplifier circuit. The control circuit has a function of setting a voltage of the first sample-and-hold circuit to a second voltage. The first amplifier circuit has a function of outputting a third voltage to an output terminal of the first amplifier circuit. The first sample-and-hold circuit includes a first transistor whose on/off state is controlled by the control circuit. The first transistor includes an oxide semiconductor in a channel formation region.

In the semiconductor device of one embodiment of the present invention, it is preferable that the control circuit include a processor, a digital-analog converter circuit, and a decoder circuit; the decoder circuit be electrically connected to a gate of the first transistor; the digital-analog converter circuit be electrically connected to one of a source and a drain of the first transistor; the decoder circuit have a function of outputting a signal for controlling the on/off state of the first transistor in accordance with control of the processor; and the digital-analog converter circuit have a function of outputting the second voltage in accordance with control of the processor.

In the semiconductor device of one embodiment of the present invention, it is preferable that the reference voltage generating circuit have a function of applying the first voltage to the digital-analog converter circuit and the processor have a function of stopping the first voltage applied to the digital-analog converter circuit from the reference voltage generating circuit.

In the semiconductor device of one embodiment of the present invention, it is preferable that the stabilized power supply circuit include a second sample-and-hold circuit; the control circuit include an analog-digital converter circuit; the second sample-and-hold circuit include a second transistor whose on/off state is controlled by the decoder circuit; and the second transistor include an oxide semiconductor in a channel formation region.

In the semiconductor device of one embodiment of the present invention, it is preferable that the stabilized power supply circuit include a switching circuit; the switching circuit include an input-output terminal; the switching circuit include a first switch and a second switch; one of terminals of the first switch is electrically connected to an output terminal of the first amplifier circuit; one of terminals of the second switch is electrically connected to the analog-digital converter circuit; the other of the terminals of the first switch is electrically connected to the input-output terminal; the other of the terminals of the second switch is electrically connected to the input-output terminal; the switching circuit has a function of switching a first function, a second function, and a third function; the first function be to apply the third voltage to the input-output terminal by turning on the first switch; the second function be to apply the third voltage to the analog-digital converter circuit through the input-output terminal by turning on the first switch and the second switch; and the third function be to turn on the first switch and the second switch exclusively, to output the third voltage when the first switch is in an on state and the second switch is in an off state, and to monitor a fourth voltage applied to the input-output terminal when the first switch is in an off state and the second switch is in an on state.

In the semiconductor device of one embodiment of the present invention, it is preferable that the reference voltage generating circuit include an antenna; and the reference voltage generating circuit have a function of generating the first voltage by any one of an electromagnetic coupling method, an electromagnetic induction method, and a radio wave method.

One embodiment of the present invention can provide a semiconductor device and an electronic device each having a novel configuration, and the like. One embodiment of the present invention can provide a semiconductor device and an electronic device each having a novel configuration in which an increase in the circuit area can be inhibited, and the like. One embodiment of the present invention can provide a semiconductor device and an electronic device each having a novel configuration in which power consumption can be reduced, and the like. One embodiment of the present invention can provide a semiconductor device and an electronic device each having a novel configuration in which noise in a power supply circuit can be reduced, and the like.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

BRIEF DESCRIPTION OF THE DRAWINGS

FIG. 11A is a schematic exploded perspective view illustrating a configuration example of a display device and FIG. 11B is a block diagram illustrating a configuration example of a driver IC.

FIGS. 15A and 15B are cross-sectional views each illustrating a configuration example of a display panel.

FIG. 17A is a flow chart showing an example of a method for manufacturing an electronic component, FIG. 17B is a top view of a semiconductor wafer, FIG. 17C is a partial enlarged view of FIG. 17B, FIG. 17D is a schematic view illustrating a configuration example of a chip, and FIG. 17E is a schematic perspective view illustrating a configuration example of an electronic component.

FIG. 20A is a plan view illustrating a configuration example of an OS (oxide semiconductor) transistor and FIGS. 20B and 20C are cross-sectional views of the OS transistor in FIG. 20A.

FIG. 23A is a plan view illustrating a configuration example of an OS transistor, and FIGS. 23B and 23C are cross-sectional views of the OS transistor in FIG. 23A.

FIG. 24A is a plan view illustrating a configuration example of an OS transistor, and FIGS. 24B and 24C are cross-sectional views of the OS transistor in FIG. 24A.

FIG. 25A is a plan view illustrating a configuration example of an OS transistor, and FIGS. 25B and 25C are cross-sectional views of the OS transistor in FIG. 25A.

DETAILED DESCRIPTION OF THE INVENTION

Figure 1:
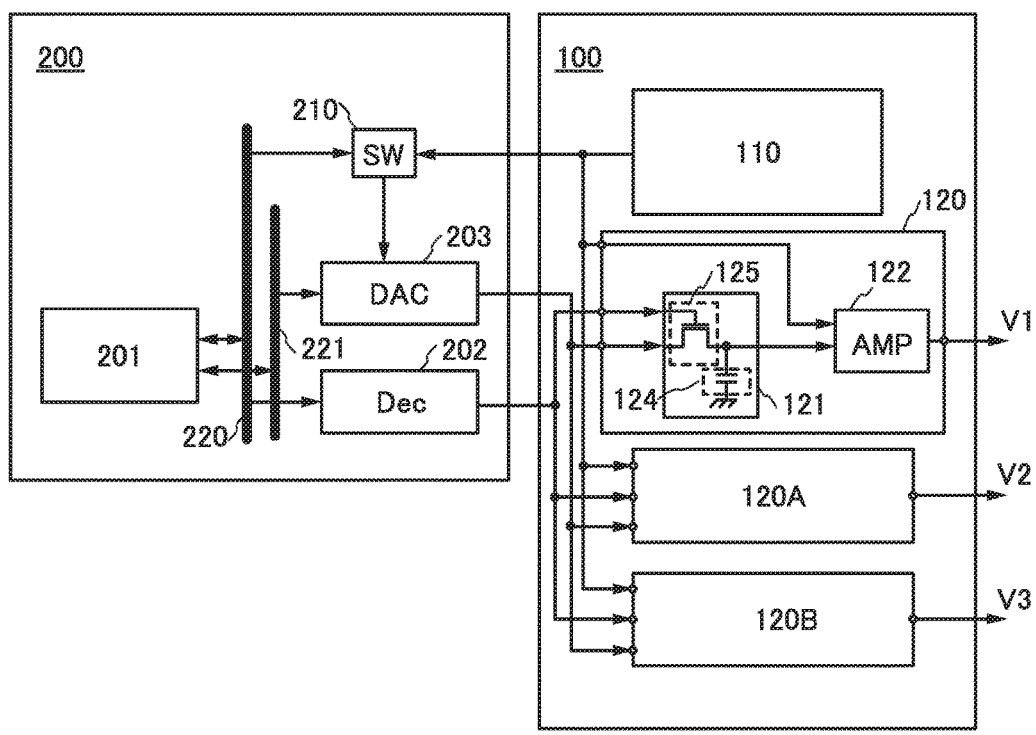
FIG. 1 is a block diagram illustrating a semiconductor device.

Hereinafter, embodiments will be described with reference to drawings. The embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

In this specification, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the term "electrically connected" includes the case where components are connected through an object having any electric function. There is no particular limitation on the "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°. Thus, the case where the angle is greater than or equal to 85° and less than or equal to 95° is also included.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, off-state current in this specification and the like refers to drain current of a transistor in an off state (also referred to as a non-conducting state and a cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. Thus, "the off-state current of a transistor is lower than or equal to I" may mean "there is Vgs with which the off-state current of the transistor becomes lower than or equal to I". Furthermore, "the off-state current of a transistor" means "the off-state current in an off state at predetermined Vgs", "the off-state current in an off state at Vgs in a predetermined range", "the off-state current in an off state at Vgs with which sufficiently reduced off-state current is obtained", or the like.

As an example, the assumption is made of an n-channel transistor where the threshold voltage $V_{th}$ is 0.5 V and the drain current is $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at Vgs of −0.5 V or at Vgs in the range of −0.8 V to −0.5 V; therefore, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value per channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is Vgs at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage Vds between its drain and source in some cases. Unless otherwise specified, the off-state current in this specification may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at Vds at which the required reliability of a semiconductor device or the like including the transistor is ensured or Vds at which the semiconductor device or the like including the transistor is used. The description "an off-state current of a transistor is lower than or equal to a current I" may mean that there is $V_{gs}$ at which the off-state current of the transistor is lower than or equal to the current I at a voltage $V_{ds}$ of 0.1 V, 0.8 V, 1 V, 1.2 V, 1.8 V, 2.5 V, 3 V, 3.3 V, 10 V, 12 V, 16 V, or 20 V, at a voltage $V_{ds}$ at which the reliability of a semiconductor device or the like including the transistor is ensured, or at a voltage $V_{ds}$ at which in the semiconductor device or the like including the transistor is used.

In the above description of off-state current, a drain may be replaced with a source. That is, the off-state current sometimes refers to a current that flows through a source of a transistor in the off state.

In this specification and the like, the term "leakage current" sometimes expresses the same meaning as "off-state current". In this specification and the like, the off-state current sometimes refers to current that flows between a source and a drain of a transistor in the off state, for example.

Embodiment 1

In this embodiment, configurations of a semiconductor device serving as a power supply circuit which outputs different power supply voltages are described with reference to FIG. 1, FIGS. 2A and 2B, FIGS. 3A and 3B, FIG. 4, and FIGS. 5A to 5C.

FIG. 1 is a block diagram illustrating a configuration example of a semiconductor device. A semiconductor device 1000 includes a power supply control circuit 100 and a control circuit 200.

The power supply control circuit 100 is a circuit for outputting different power supply voltages to an external circuit. The power supply control circuit 100 includes a reference voltage generating circuit 110 and a stabilized power supply circuit 120, for example. The stabilized power supply circuit 120 includes a sample-and-hold circuit 121 and an amplifier circuit 122.

The reference voltage generating circuit 110 is a circuit for generating a voltage which is applied to each circuit included in the semiconductor device 1000 and used as a reference.

The sample-and-hold circuit 121 is a circuit for holding a charge depending on a voltage value. The value of a voltage applied to the sample-and-hold circuit 121 is controlled by the control circuit 200. The amplifier circuit 122 can output a voltage corresponding to a charge held in the sample-and-hold circuit 121. Furthermore, the amplifier circuit 122 has a function of increasing the current supply capability. Accordingly, a signal output as the output voltage V1 is a signal obtained by current amplification in the amplifier circuit 122. A signal output as an output voltage V2 is a signal obtained by current amplification in a stabilized power supply circuit 120A. A signal output as an output voltage V3 is a signal obtained by current amplification in a stabilized power supply circuit 120B.

The control circuit 200 is a circuit for controlling the output voltages V1 to V3 of the power supply control circuit 100. The control circuit 200 includes a processor 201, a decoder circuit 202, a digital-analog converter circuit 203, a switch 210, an address bus 220, and a data bus 221, for example.

The processor 201 is a circuit for executing instructions contained in a software program. An instruction from the processor 201 is input to the decoder circuit 202 through the address bus 220, and the decoder circuit 202 restores the instruction. The decoder circuit 202 generates a signal for selecting the stabilized power supply circuit 120 to be accessed by the instruction restored by the decoder circuit 202. The digital-analog converter circuit 203 is a circuit for converting digital data input from the processor 201 through the data bus 221 into analog data. The analog data corresponds to the value of a voltage applied to the sample-and-hold circuit 121. Although not illustrated in FIG. 1, the digital-analog converter circuit 203 is connected to the address bus 220. The same applies to semiconductor devices illustrated in FIG. 6, FIG. 7, FIGS. 8A and 8B, and FIG. 9.

The sample-and-hold circuit 121 includes a transistor 125 and a capacitor 124. One of a source and a drain of the transistor 125 is connected to the digital-analog converter circuit 203 in the control circuit 200. The other of the source and the drain of the transistor 125 is connected to one electrode of the capacitor 124 and the amplifier circuit 122.

As the transistor 125, a transistor whose leakage current in an off state (off-state current) is extremely low is used. When a transistor with an extremely low off-state current is used as the transistor 125, a charge in the capacitor 124 can be held for a long time. Even when analog data is written from the digital-analog converter circuit to another sample-and-hold circuit, the charge held in the capacitor 124 can be held by keeping the transistor 125 off. In the transistor 125 with a low off-state current, isolation can be secured, and thus the influence of change in the potential due to charge transfer between a node connected to the one of the source and the drain and a node connected to the other of the source and the drain can be made small.

The software can control the control circuit 200 through the processor 201. That is, the software can change a voltage of the stabilized power supply circuit as appropriate. The operation state of the circuit to which a voltage is applied by the stabilized power supply circuit is changed by the software. Accordingly, the value of a voltage applied to the sample-and-hold circuit 121 can be changed by a change of the operation state of the circuit.

Although FIG. 1 illustrates an example in which three stabilized power supply circuits, the stabilized power supply circuits 120, 120A, and 120B, which are connected to the digital-analog converter circuit 203, are included, the number of stabilized power supply circuits is not limited to this example.

Each of the stabilized power supply circuits included in the semiconductor device 1000 of one embodiment of the present invention can change an output voltage with the sample-and-hold circuit 121 including the transistor 125 and the capacitor 124 and the amplifier circuit 122. The configuration can be a simple circuit configuration, leading to a reduction in a circuit area.

The power supply control circuit 100 can change a charge held in the capacitor 124 included in the stabilized power supply circuit 120 in accordance with the kind or the operation state of a circuit which outputs a power supply voltage and change an output voltage.

Figure 2A:
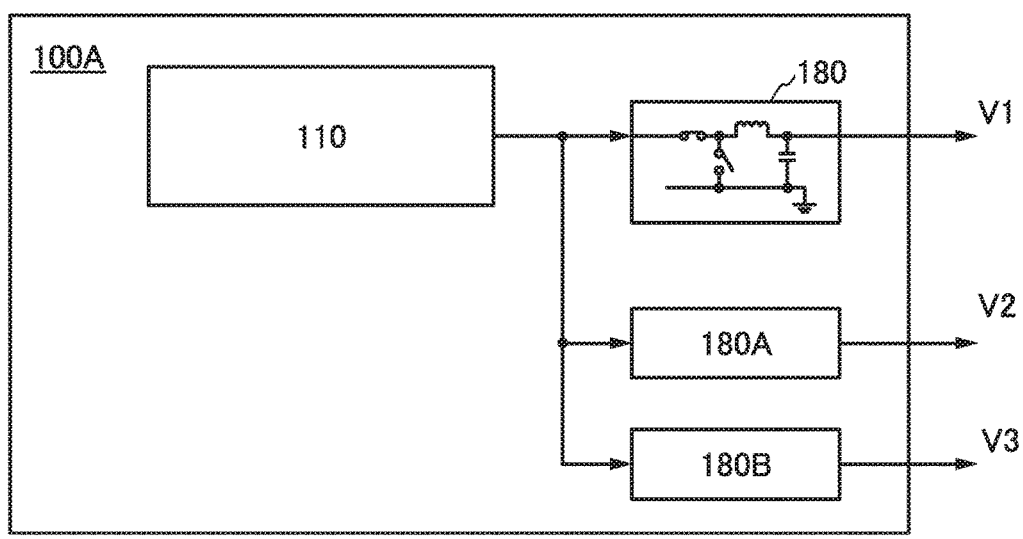
FIGS. 2A and 2B are each a block diagram of a power supply control circuit.
Figure 2B:
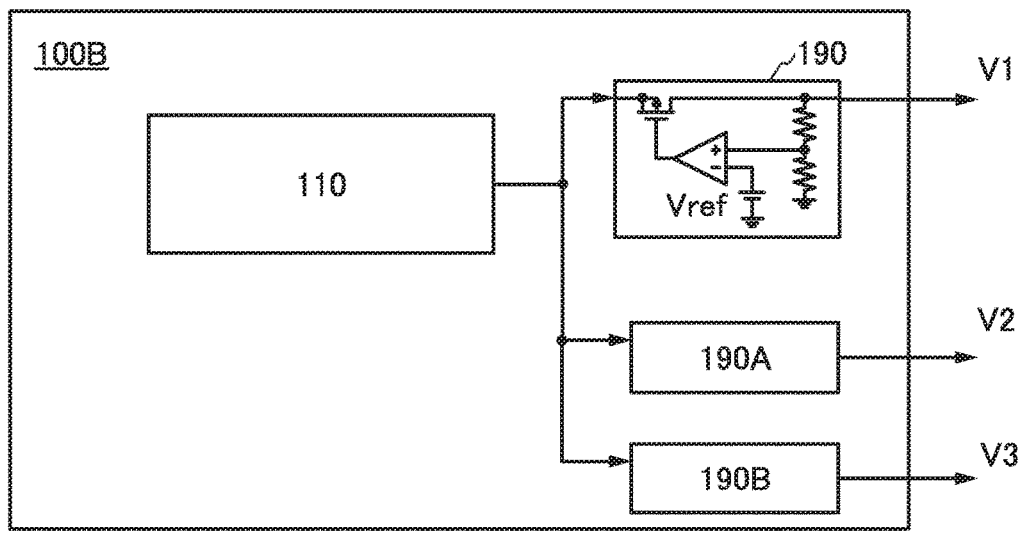

Here, FIGS. 2A and 2B illustrate power supply control circuits different from the power supply control circuit 100 in FIG. 1.

A power supply control circuit 100A illustrated in FIG. 2A includes a stabilized power supply circuit 180, a stabilized power supply circuit 180A, and a stabilized power supply circuit 180B, each of which is composed of a switching regulator. A power supply control circuit 100B illustrated in FIG. 2B includes a stabilized power supply circuit 190, a stabilized power supply circuit 190A, and a stabilized power supply circuit 190B, each of which is composed of a linear regulator.

The output voltage of each of the power supply control circuit 100A, which is composed of a switching regulator, and the power supply control circuit 100B, which is composed of a linear regulator, depends on a circuit configuration designed in advance. Accordingly, it is difficult to change an output voltage in accordance with the kind of a circuit or the operation state recognized by the software in the configuration of FIG. 2A or 2B.

In the case of the stabilized power supply circuit 180 illustrated in FIG. 2A, switching is performed at high speed in generation of a voltage, and thus noise with a high frequency wave or spike noise is generated. Also in the stabilized power supply circuits 180A and 180B having the same circuit configuration, noise with a high frequency wave or spike noise is generated. That is, noise or spike noise is generated in the plurality of circuits. In contrast, in the stabilized power supply circuit 120 in the semiconductor device 1000 of one embodiment of the present invention, a desired voltage is generated with the digital-analog converter circuit 203 and the stabilized power supply circuit 120, and thus a switching operation is unnecessary. Accordingly, generation of noise can be suppressed in the stabilized power supply circuit 120 included in the semiconductor device 1000 of one embodiment of the present invention.

In the case of the stabilized power supply circuit 190 illustrated in FIG. 2B, the power conversion efficiency is lowered because a decreased amount of voltage is released as Joule heat by a semiconductor element or a resistor in order to obtain a low output voltage from a high input voltage. In contrast, in the case of the stabilized power supply circuit 120 in the semiconductor device 1000 of one embodiment of the present invention, the first voltage is changed with the digital-analog converter circuit 203 and the stabilized power supply circuit 120, and thus a desired voltage can be generated without a reduction in the power conversion efficiency. Accordingly, reductions in power consumption and heat generation can be achieved in the stabilized power supply circuit 120 included in the semiconductor device 1000 of one embodiment of the present invention.

The digital-analog converter circuit 203 is connected to the plurality of stabilized power supply circuits 120 and thus can be shared among the plurality of stabilized power supply circuits 120. In contrast, in the case of the configuration using a regulator illustrated in FIG. 2A or 2B, circuit configurations which are fixed to the respective output voltages are needed. Thus, the circuit area of the stabilized power supply circuit 120 included in the semiconductor device 1000 of one embodiment of the present invention can be reduced.

In the semiconductor device 1000 of one embodiment of the present invention, a wiring with which the digital-analog converter circuit 203 is connected to the plurality of stabilized power supply circuits 120 can be used in common. The circuit area for a wiring can be reduced as compared with the case where the stabilized power supply circuits 180 each including a switching regulator illustrated in FIG. 2A are connected using a plurality of wirings or the case where the stabilized power supply circuits 190 each including a linear regulator illustrated in FIG. 2B are connected using a plurality of wirings. In addition, although a guard pattern and the like for preventing noise are necessary because a circuit for handling an analog signal is easily affected by noise, the plurality of wirings are used in common in the semiconductor device 1000, whereby a wiring region protected by a guard pattern and the like for preventing noise can be reduced. Accordingly, the circuit area for providing an additional guard pattern and the like for preventing noise can be reduced in the semiconductor device 1000.

FIG. 1 illustrates the switch 210 provided between the reference voltage generating circuit 110 and the digital-analog converter circuit 203 as an example. A transistor can be used as the switch 210, for example.

The switch 210 has a function of power gating. Although the switch 210 is provided between the reference voltage generating circuit 110 and the digital-analog converter circuit 203 in FIG. 1, the switch 210 can also be used in another configuration. For example, the switch 210 can be used for the processor 201 or the decoder circuit 202 for power gating. Furthermore, the switch 210 preferably has a function of a latch for holding an operation state of the switch 210.

The digital-analog converter circuit 203 may maintain output of analog data only during a period in which the sample-and-hold circuit 121 is selected by the decoder circuit 202 or the like. When the switch 210 is turned off during a non-selection period of the sample-and-hold circuit 121, the supply of power to the digital-analog converter circuit 203 is stopped, leading to a reduction in standby power.

Note that it is preferable that a transistor used as the switch 210 be a transistor with an extremely low off-state current like the transistor 125 included in the sample-and-hold circuit 121 used in the stabilized power supply circuit 120.

Since the digital-analog converter circuit 203 is connected to the stabilized power supply circuits 120, 120A, and 120B in the power supply control circuit described in this embodiment with one wiring, a reduction in circuit scale, power consumption, and noise can be achieved, and thus the power supply control circuit in this embodiment is especially effective as a power supply control circuit which keeps applying a constant voltage.

Note that as the transistor with an extremely low off-state current, a transistor including a semiconductor having a wider band gap than silicon can be used. As the semiconductor having a wider band gap than silicon, a compound semiconductor such as an oxide semiconductor or a nitride semiconductor can be given. A transistor including an oxide semiconductor in a channel formation region can be used as a transistor with an extremely low off-state current, for example.

Alternatively, for example, a transistor including silicon having crystallinity in a semiconductor layer in which a channel is formed (also referred to as a "crystalline Si transistor") tends to obtain relatively high mobility as compared to the OS transistor. On the other hand, the crystalline Si transistor has difficulty in obtaining extremely small off-state current unlike the OS transistor. Thus, it is important that the semiconductor material used for the semiconductor layer be selected depending on the purpose and the usage.

As the transistor 125 used in the sample-and-hold circuit 121, a transistor in which a channel is formed in an oxide semiconductor film can be used depending on the purpose and the usage. By utilizing a feature of low off-state current of a transistor in which a channel is formed in an oxide semiconductor film, a change in the potential due to transfer of charge held in the sample-and-hold circuit 121 can be suppressed.

With a feature of low off-state current of a transistor in which a channel is formed in an oxide semiconductor film, isolation between a source and a drain can be secured. As an example illustrated in FIG. 1, a wiring with which the digital-analog converter circuit 203 is connected to the stabilized power supply circuits 120, 120A, and 120B can be used in common. Note that the influence of change in the potential of the wiring used in common on the voltage held in the sample-and-hold circuit 121 can be suppressed by use of the transistor 125 with a low off-state current.

As described above, the transistor 125 has low off-state current, and thus a change in the potential in the sample-and-hold circuit 121 can be suppressed. The amplifier circuit 122 including a crystalline Si transistor can operate at high speed. A combination of the sample-and-hold circuit 121 and the amplifier circuit 122 is especially effective because the semiconductor device 1000 can obtain an amplification effect with high efficiency.

Note that it is preferable that the OS transistor and the crystalline Si transistor be formed over the same substrate. For example, it is preferable that the crystalline Si transistor be formed over a single crystal Si wafer, and the OS transistor be formed thereover. When these transistors are formed over the same substrate, the sample-and-hold circuit 121 and the amplifier circuit 122 can be formed over the same substrate, so that the circuit area of the semiconductor device 1000 can be made small.

Figure 3A:
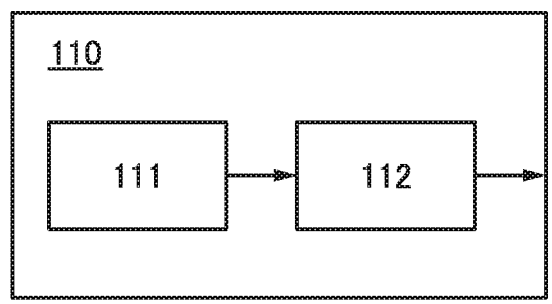
FIGS. 3A and 3B are block diagrams each illustrating a reference voltage generating circuit.

FIG. 3A illustrates an example of the reference voltage generating circuit 110. The reference voltage generating circuit 110 illustrated in FIG. 3A includes a pulse width modulation circuit 111 and a direct-current voltage converter circuit 112. The reference voltage generating circuit 110 can also have a configuration other than the configuration of FIG. 3A.

Figure 3B:
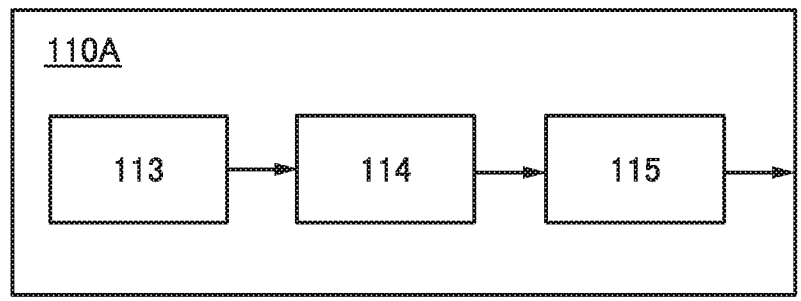

A reference voltage generating circuit 110A illustrated in FIG. 3B includes an antenna circuit 113, a rectifier 114, and a battery 115. As a transmission method of a signal received by the antenna circuit 113, one or a combination of an electromagnetic coupling method, an electromagnetic induction method, and a radio wave method can be used. The transmission method may be selected as appropriate by a practitioner in consideration of application use, and an antenna having optimal length and shape may be provided in accordance with the transmission method.

Figure 4:
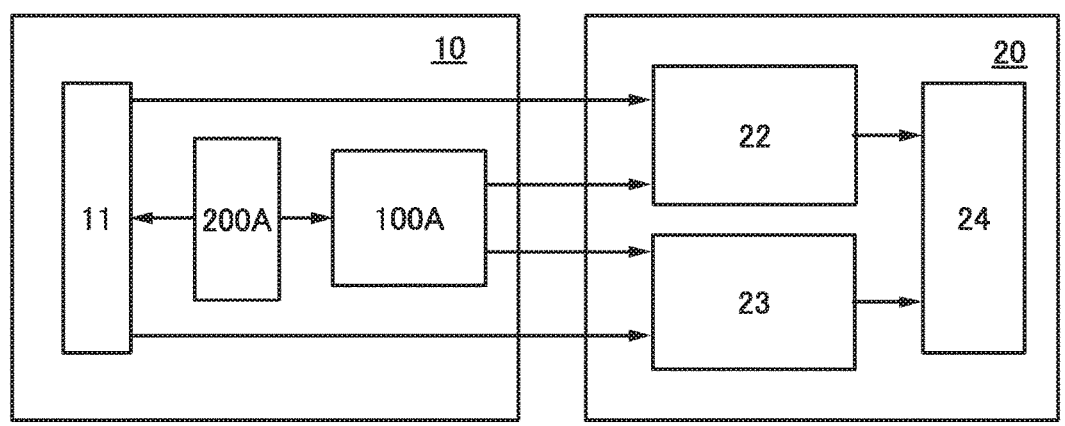
FIG. 4 is a block diagram illustrating a semiconductor device.

Next, FIG. 4 illustrates a control device 10 and a display device 20 operated by the control system 10 as an example of a device including the semiconductor device 1000 illustrated in FIG. 1.

The control system 10 includes the power supply control circuit 100A, a control circuit 200A, and a signal generation circuit 11. The display device 20 includes a scan driver 22, a source driver 23, and a pixel portion 24. The power supply control circuit 100 included in the above semiconductor device 1000 can be used as the power supply control circuit 100A. The control circuit 200 can be used as the control circuit 200A.

The scan driver 22 controls a scan line. The source driver 23 outputs display data to a signal line. The pixel portion 24 includes a plurality of pixels connected to scan lines and signal lines.

The scan driver 22 and the source driver 23 in the display device 20 are driven at different power supply voltages. Accordingly, the power supply control circuit 100A supplies different power supply voltages to the scan driver 22 and the source driver 23.

Next, configuration examples of the sample-and-hold circuit 121 included in the stabilized power supply circuit 120 according to one embodiment of the present invention, which are different from the configuration in FIG. 1, are described with reference to FIGS. 5A to 5C.

Figure 5A:
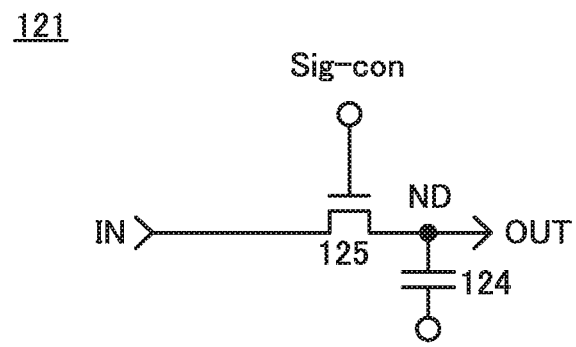
FIGS. 5A to 5C are each a circuit diagram of a sample-and-hold circuit.

The sample-and-hold circuit 121 illustrated in FIG. 5A includes the transistor 125 having a function of a switch and the capacitor 124. The transistor 125 has a function of controlling supply of an input signal to a node ND. The capacitor 124 has a function of accumulating a charge in accordance with a potential of the above signal. The potential of the node ND is supplied as an output of the sample-and-hold circuit 121. A gate of the transistor 125 is controlled by a selection signal generated by the decoder circuit 202, such as a signal Sig-con.

Figure 5B:
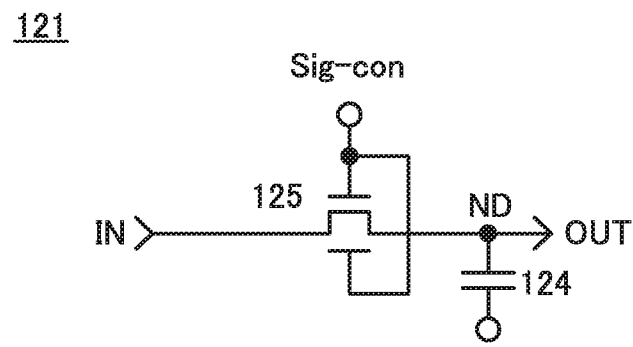

The sample-and-hold circuit 121 illustrated in FIG. 5B differs from that illustrated in FIG. 5A in that the transistor 125 includes a pair of gates electrically connected to each other. The pair of gates preferably have regions overlapping with each other with a channel formation region positioned therebetween. The transistor 125 having the above configuration can have large on-state current as compared with the transistor 125 illustrated in FIG. 5A.

Figure 5C:
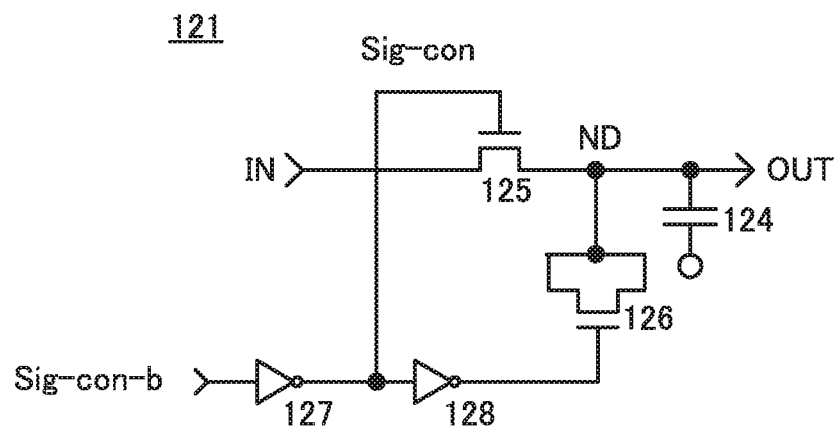

The sample-and-hold circuit 121 illustrated in FIG. 5C includes a transistor 126, an inverter 127, and an inverter 128 in addition to the components in the sample-and-hold circuit 121 illustrated in FIG. 5A. A source and a drain of the transistor 126 are electrically connected to the node ND. A signal Sig-con-b obtained by inversion of a logic value of the signal Sig-con is input to an input terminal of the inverter 127, and an output terminal of the inverter 127 is electrically connected to the gate of the transistor 125 and an input terminal of the inverter 128. Accordingly, the signal Sig-con is input to the gate of the transistor 125 and a gate of the transistor 126. The above configuration enables the sample-and-hold circuit 121 in FIG. 5C to suppress charge injection.

Although FIGS. 5A to 5C illustrates the case where the on/off state of the transistor 125 is directly controlled in response to the signal Sig-con, the on/off state of the transistor 125 in FIGS. 5A to 5C may be controlled in response to a signal corresponding to the signal Sig-con. In FIG. 5C, when the on/off state of the transistor 125 is controlled by a signal corresponding to the signal Sig-con, a signal corresponding to the signal Sig-con-b is input to the input terminal of the inverter 127.

The structure and method described in this embodiment can be implemented by being combined as appropriate with any of the other structures and methods described in the other embodiments.

Embodiment 2

In this embodiment, a configuration different from that of the power supply control circuit illustrated in FIG. 1 is described. Specifically, a power supply control circuit having a function of feedback control is described with reference to FIG. 6.

Figure 6:
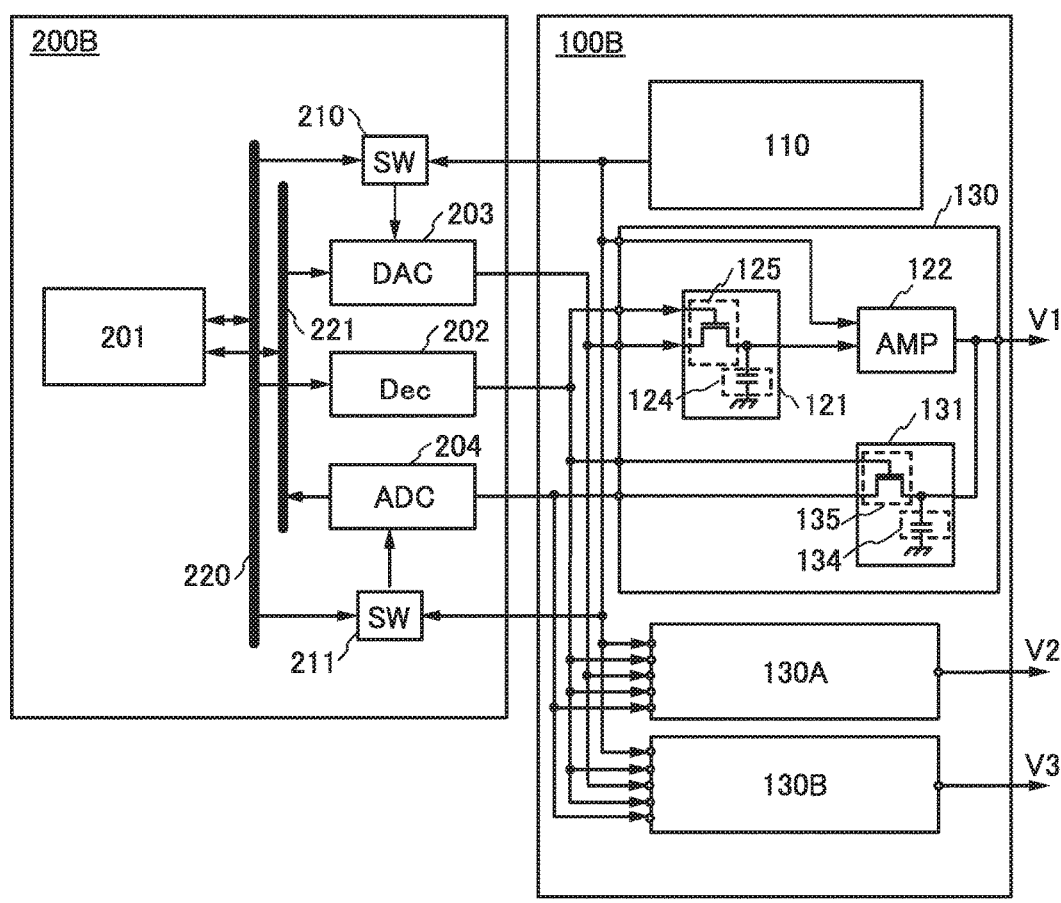
FIG. 6 is a block diagram illustrating a semiconductor device.

FIG. 6 is a block diagram illustrating a configuration example of a semiconductor device. A semiconductor device 1000A includes the power supply control circuit 100B and a control circuit 200B.

The semiconductor device 1000A in FIG. 6 differs from the semiconductor device 1000 in FIG. 1 in that a sample-and-hold circuit 131 is included in a stabilized power supply circuit 130 in the power supply control circuit 100B, and an analog-digital converter circuit 204 and a switch 211 are included in the control circuit 200B.

The sample-and-hold circuit 131 is a circuit for holding a charge depending on an output voltage. The sample-and-hold circuit 131 includes a capacitor 134 and a transistor 135. The sample-and-hold circuit 131 holds a charge depending on the output voltage V1 controlled by the control circuit 200B in the capacitor 134.

The control circuit 200B has a function of monitoring whether a voltage of the sample-and-hold circuit 121 is output correctly. The decoder circuit 202 can select the sample-and-hold circuit 131. The analog-digital converter circuit 204 can convert the output voltage V1 applied through the sample-and-hold circuit 131 into digital data. Accordingly, the processor 201 can monitor the output voltage V1.

The processor 201 can calculate ΔV1, which is a difference between data obtained by digitalization of the output voltage V1 taken from the analog-digital converter circuit 204 through the sample-and-hold circuit 131 and the value of the first voltage of the sample-and-hold circuit 121. The processor 201 can manage a range of ΔV1 used in operation as a set value. The processor 201 has a function of setting the range of ΔV1 as an output error range arbitrarily. Accordingly, a change in an output voltage can be suppressed in the stabilized power supply circuit 130 included in the semiconductor device 1000A of one embodiment of the present invention.

The analog-digital converter circuit 204 may operate for input of analog data only during a period in which the sample-and-hold circuit 131 is selected by the decoder circuit 202 or the like. When the switch 211 is turned off during a non-selection period of the sample-and-hold circuit 131, the supply of power to the analog-digital converter circuit 204 is stopped, leading to a reduction in standby power.

Note that it is preferable that a transistor used as the switch 211 be a transistor with an extremely low off-state current like the transistor 125 included in the sample-and-hold circuit 121 used in the stabilized power supply circuit 130.

The processor 201 can set a voltage of the sample-and-hold circuit 121 with the digital-analog converter circuit 203. The voltage of the sample-and-hold circuit 121 is subjected to current amplification by the amplifier circuit 122 and can be output as the output voltage V1. The output voltage V1 is applied to the analog-digital converter circuit 204 through the sample-and-hold circuit 131 and converted in to digital data. The processor 201 receives the digital data from the analog-digital converter circuit 204 and thus can detect a difference between the voltage set by the processor 201 and the output voltage V1 (ΔV1). When the processor 201 calculates ΔV1, the stabilized power supply circuit 130 forms a feedback loop. The stabilized power supply circuit 130 having a feedback loop is especially effective because change in an output voltage generated by various causes such as an increase in a current load of a circuit supplied with the output voltage V1 or deterioration of an element can be suppressed and thus the accuracy of the output voltage V1 can be increased.

The structure and method described in this embodiment can be implemented by being combined as appropriate with any of the other structures and methods described in the other embodiments.

Embodiment 3

In this embodiment, a power supply control device having an analog input/output function is described with reference to FIG. 7.

Figure 7:
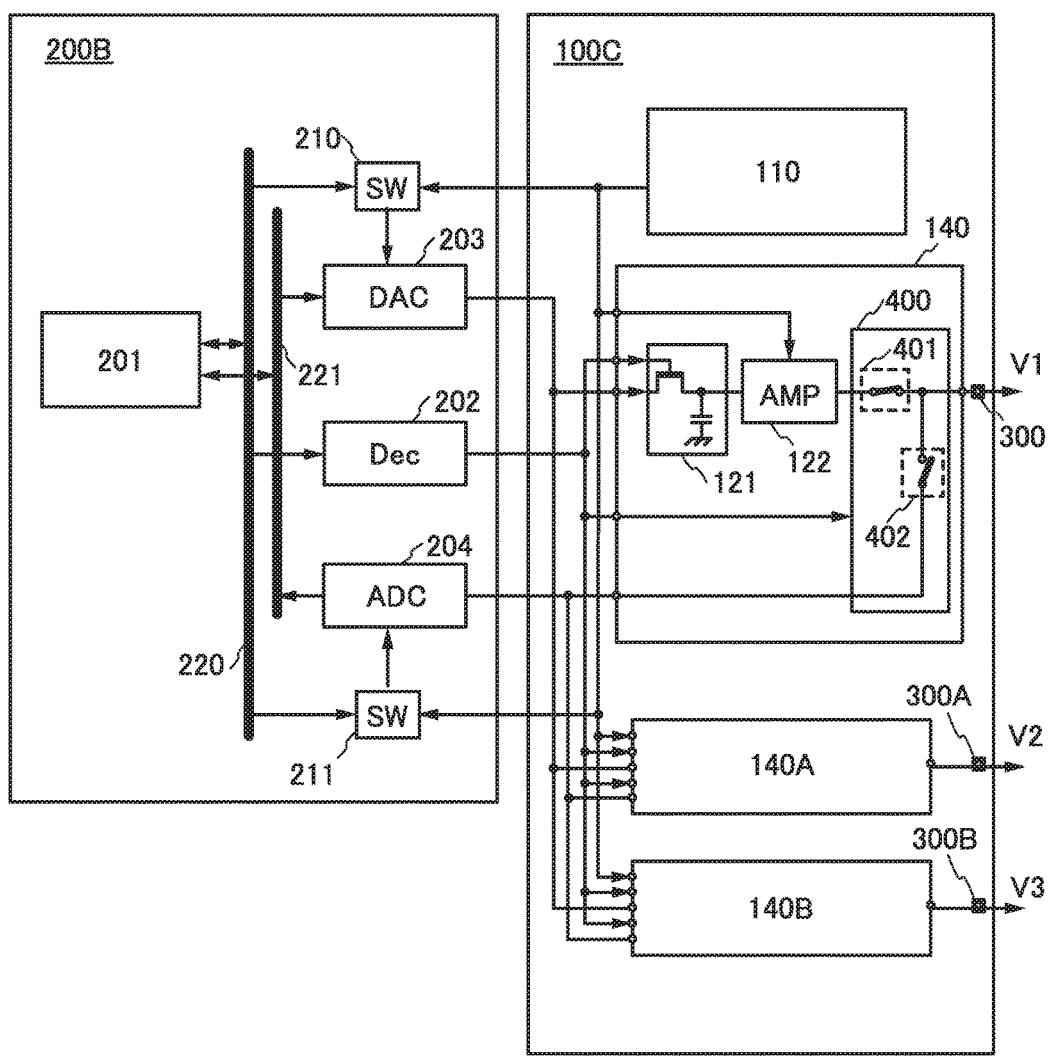
FIG. 7 is a block diagram illustrating a semiconductor device.

FIG. 7 is a block diagram illustrating a configuration example of a semiconductor device. A semiconductor device 1000B includes a power supply control circuit 100C and the control circuit 200B.

The power supply control circuit 100C is a circuit having an analog input/output function. The power supply control circuit 100C includes the reference voltage generating circuit 110 and a stabilized power supply circuit 140, for example. The stabilized power supply circuit 140 includes the sample-and-hold circuit 121, the amplifier circuit 122, and a switching circuit 400.

The semiconductor device 1000B in FIG. 7 differs from the semiconductor device 1000 in FIG. 1 in that the switching circuit 400 is included in the stabilized power supply circuit 140. The switching circuit 400 includes a switch 401 and a switch 402. The switching circuit 400 has a function of outputting a voltage of the sample-and-hold circuit 121 to an input-output terminal 300 as the output voltage V1 by turning on the switch 401.

When the processor 201 turns on the switches 401 and 402, a voltage of the sample-and-hold circuit 121 is applied to the analog-digital converter circuit 204 through the input-output terminal 300, whereby a feedback loop for monitoring the input-output terminal 300 is formed.

By turning on the switches 401 and 402 used in the switching circuit 400 exclusively, the processor 201 has a function of outputting a voltage from the input-output terminal 300 and a function of detecting a voltage of the input-output terminal 300. The two functions can be controlled independently. Here, "turning on the switches 401 and 402 exclusively" means that the switch 401 is turned on while the switch 402 is turned off, for example.

In the case where the switches 401 and 402 are turned off at the same time, the semiconductor devices or the circuits connected to the input-output terminal 300 can be separated from the control circuit 200B, and thus the input-output terminal 300 has a function of power gating.

Each of the switches 401 and 402 used in the switching circuit 400 may be an electrical switch or a mechanical switch. As an electrical switch, a transistor, a diode, a photocoupler, or the like may be used. As a mechanical switch, a relay or the like may be used.

The power supply control circuit 100C described in this embodiment including the switching circuit can supply the voltage of the input-output terminal 300 to the control circuit 200B. One input-output terminal 300 has a plurality of functions such as a function of outputting the output voltage V1, a function of monitoring the output voltage V1, a power gating function, and an analog input detection function, which is especially effective.

The structure and method described in this embodiment can be implemented by being combined as appropriate with any of the other structures and methods described in the other embodiments.

Embodiment 4

In this embodiment, a semiconductor device having an analog input/output function is described with reference to FIGS. 8A and 8B.

Figure 8A:
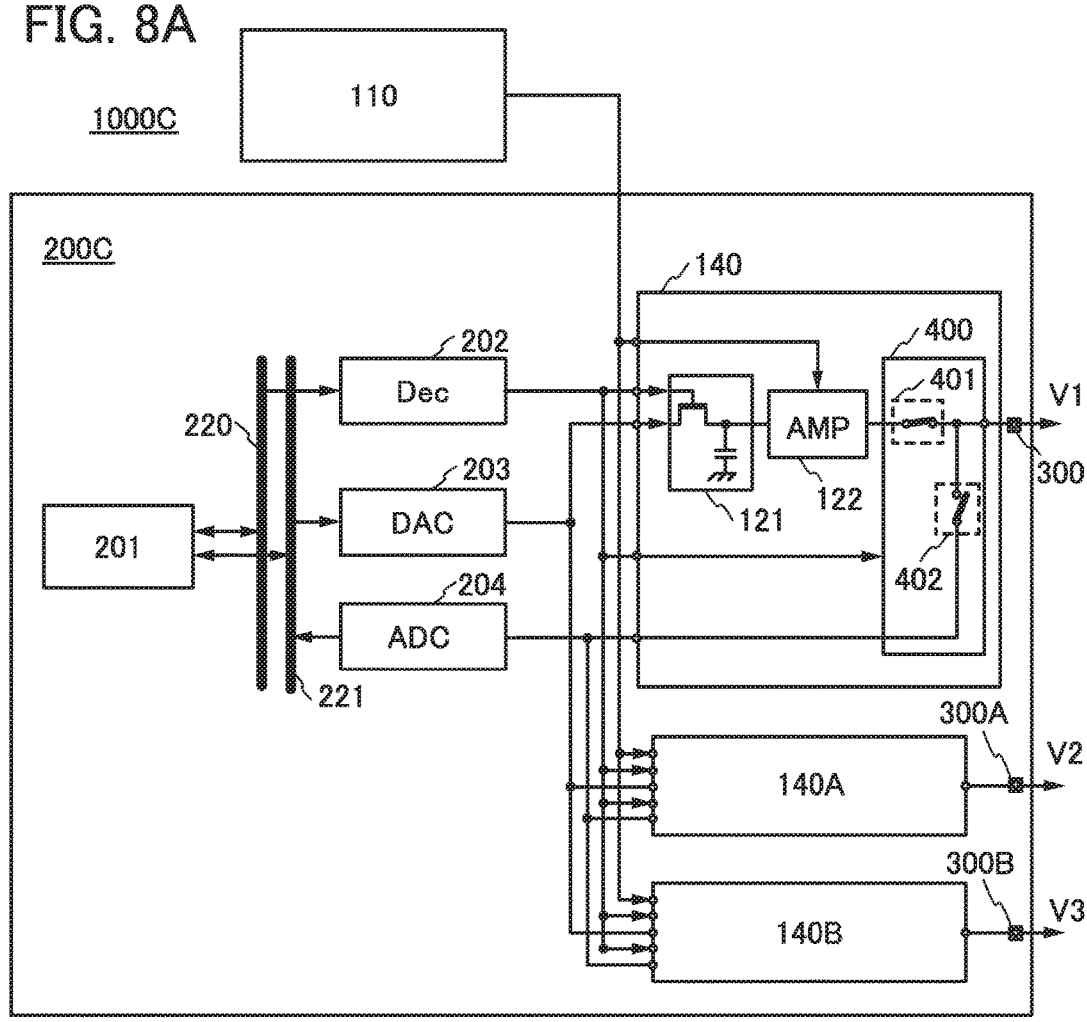
FIGS. 8A and 8B are block diagrams each illustrating a semiconductor device.

FIG. 8A is a block diagram illustrating a configuration example of a semiconductor device. A semiconductor device 1000C includes the reference voltage generating circuit 110 and a control circuit 200C.

The control circuit 200C is a circuit having an analog input/output function. The control circuit 200C includes the processor 201, the decoder circuit 202, the digital-analog converter circuit 203, the analog-digital converter circuit 204, the address bus 220, the data bus 221, and the stabilized power supply circuit 140, for example. The stabilized power supply circuit 140 includes the sample-and-hold circuit 121, the amplifier circuit 122, and the switching circuit 400.

The semiconductor device 1000C in FIG. 8A differs from the semiconductor device 1000B in FIG. 7 in that the stabilized power supply circuit 140 is integrated in the control circuit 200C. With such a configuration, the number of components of the semiconductor device can be reduced.

When the reference voltage generating circuit 110 is connected to the control circuit 200C, power is supplied to the amplifier circuit 122.

In FIG. 8A, the stabilized power supply circuit 140, the processor 201, the digital-analog converter circuit 203, the analog-digital converter circuit 204, and the decoder circuit 202 can be integrated in one semiconductor device. With such a configuration, the areas of a mounted component and a wiring can be reduced. Although FIG. 8A illustrates three stabilized power supply circuits, the stabilized power supply circuits 140, 140A, and 140B, the number of stabilized power supply circuits is not limited to this example.

Figure 8B:
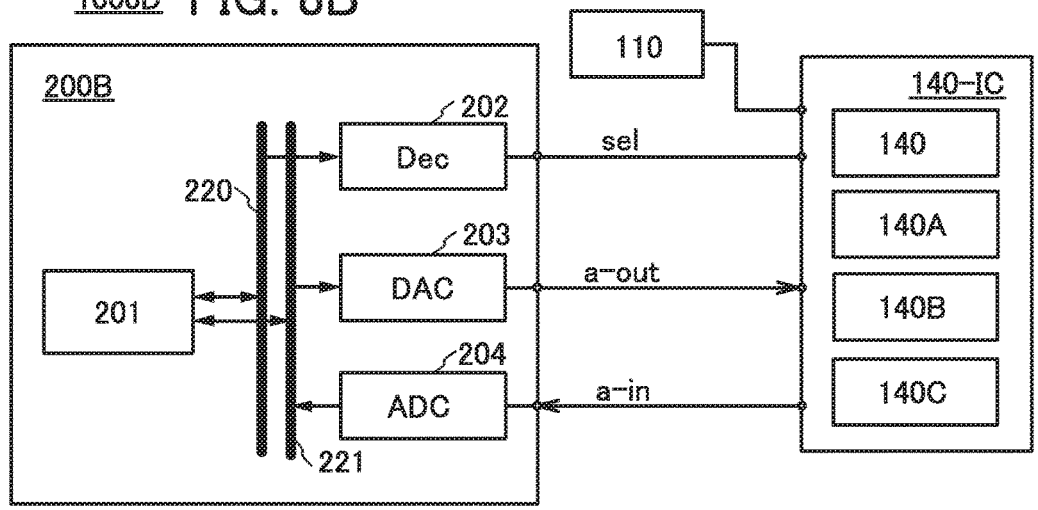

FIG. 8B is a block diagram illustrating a configuration example of a semiconductor device. A semiconductor device 1000D includes the reference voltage generating circuit 110, the control circuit 200B, and a semiconductor device 140-IC.

In FIG. 8B, a plurality of stabilized power supply circuits is integrated in one semiconductor device 140-IC. The control circuit 200B outputs an output signal a-out of the digital-analog converter circuit 203 to the semiconductor device 140-IC, the control circuit 200B inputs an input signal a-in of the analog-digital converter circuit 204 from the semiconductor device 140-IC, and the control circuit 200B outputs a selection signal sel generated by the decoder circuit 202 to the semiconductor device 140-IC. One stabilized power supply circuit has one analog input/output function. An example in which four stabilized power supply circuits are integrated in the semiconductor device 140-IC is described, but the number of stabilized power supply circuits is not limited to this example.

For the selection signal sel, serial communication standard can be employed. Accordingly, the number of wirings can be fixed without depending on the number of stabilized power supply circuits integrated in the semiconductor device 140-IC.

When the control circuit 200C described in this embodiment includes the switching circuit, one input-output terminal in the integrated circuit has a plurality of functions such as a function of outputting the output voltage V1, a function of monitoring the output voltage V1, a power gating function, and an analog input detection function, and thus, an analog input/output function thereof can be increased easily, which is especially effective in further integration.

The structure and method described in this embodiment can be implemented by being combined as appropriate with any of the other structures and methods described in the other embodiments.

Embodiment 5

In this embodiment, a semiconductor device including an analog input/output terminal capable of timing controlling is described with reference to FIG. 9.

Figure 9:
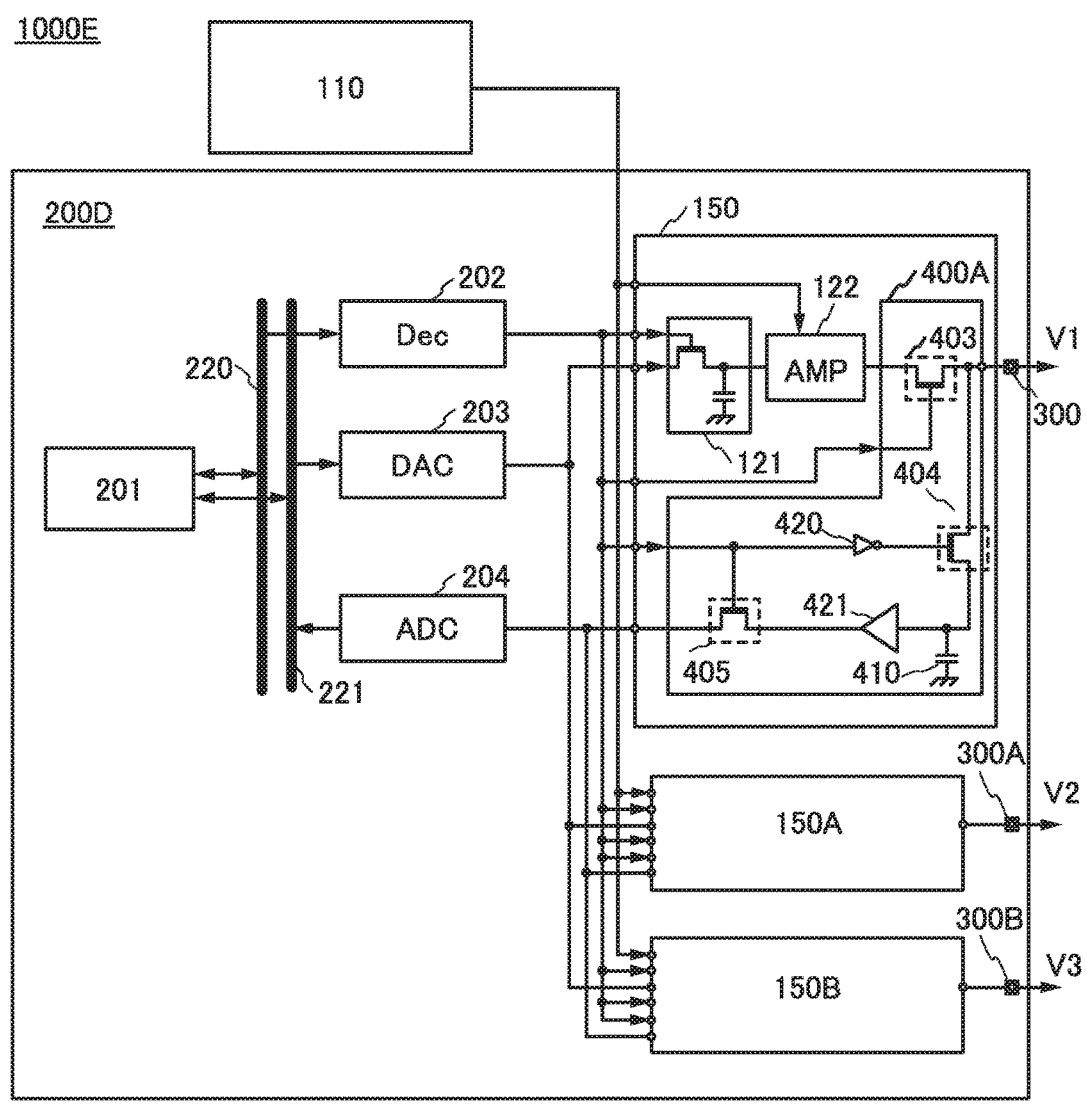
FIG. 9 is a block diagram illustrating a semiconductor device.

FIG. 9 is a block diagram illustrating a configuration example of a semiconductor device. A semiconductor device 1000E includes the reference voltage generating circuit 110 and a control circuit 200D.

The control circuit 200D is a circuit having an analog input/output function. The control circuit 200D includes the processor 201, the decoder circuit 202, the digital-analog converter circuit 203, the analog-digital converter circuit 204, the address bus 220, the data bus 221, and the stabilized power supply circuit 150, for example. The stabilized power supply circuit 150 includes the sample-and-hold circuit 121, the amplifier circuit 122, and a switching circuit 400A.

The semiconductor device 1000E in FIG. 9 differs from the semiconductor device 1000C in FIG. 8A in that a switching circuit 400A is included in the stabilized power supply circuit 150. The processor 201 can obtain data of the input-output terminal 300 at given timing.

The switching circuit 400A includes a transistor 403, a transistor 404, a transistor 405, a capacitor 410, an inverter circuit 420, and a buffer 421. One of a source and a drain of the transistor 403 is connected to an output terminal of the amplifier circuit, and the other of the source and the drain of the transistor 403 is connected to the input-output terminal 300. The transistor 403 is controlled by the decoder circuit 202. One of a source and a drain of the transistor 404 is connected to the input-output terminal 300 and the other of the source and the drain of the transistor 403; the other of the source and the drain of the transistor 404 is connected to one electrode of the capacitor and an input terminal of the buffer 421; an output terminal of the buffer 421 is connected to one of a source and a drain of the transistor 405; and the other of the source and the drain of the transistor 405 is connected to an input terminal of the analog-digital converter circuit 204. The transistor 404 and the transistor 405 are controlled by the decoder circuit 202. Note that the transistors 403 and 404 are preferably controlled independently from each other. An input terminal of the inverter circuit 420 is connected to the gate of the transistor 405, and an output terminal of the inverter circuit 420 is connected to a gate of the transistor 404.

The transistor 403 is controlled independently and thus controls an output of the output voltage V1 to the input-output terminal 300.

The transistors 404 and 405 operates exclusively by the inverter circuit 420. In the case where the function of monitoring the output voltage V1 or the analog input detection function of the input-output terminal 300 does not work, the transistor 404 is in an on state, and the transistor 405 is in an off state. Since the transistor 404 is in an on state, the capacitor 410 holds a charge corresponding to the potential of the input-output terminal 300.

When the transistor 405 is turned on by the decoder circuit 202, the transistor 404 is turned off by the inverter circuit 420. The buffer 421 is electrically connected to the analog-digital converter circuit through the transistor 405.

Note that like the transistor 125 included in the sample-and-hold circuit 121 used in the stabilized power supply circuit 150, it is preferable to use a transistor with an extremely low off-state current as each of the transistors 403, 404, and 405.

The stabilized power supply circuit illustrated in FIG. 9 can be integrated as in FIGS. 8A and 8B.

The control circuit 200D described in this embodiment can obtain data of the input-output terminal 300 at given timing. The control circuit 200D is especially effective because analog synchronization control is possible by synchronization with another control device or another circuit.

The structure and method described in this embodiment can be implemented by being combined as appropriate with any of the other structures and methods described in the other embodiments.

Embodiment 6

In this embodiment, an example in which a semiconductor device 1000t includes a control device, a display device, a touch panel device, and the like is described with reference to FIG. 10.

Figure 10:
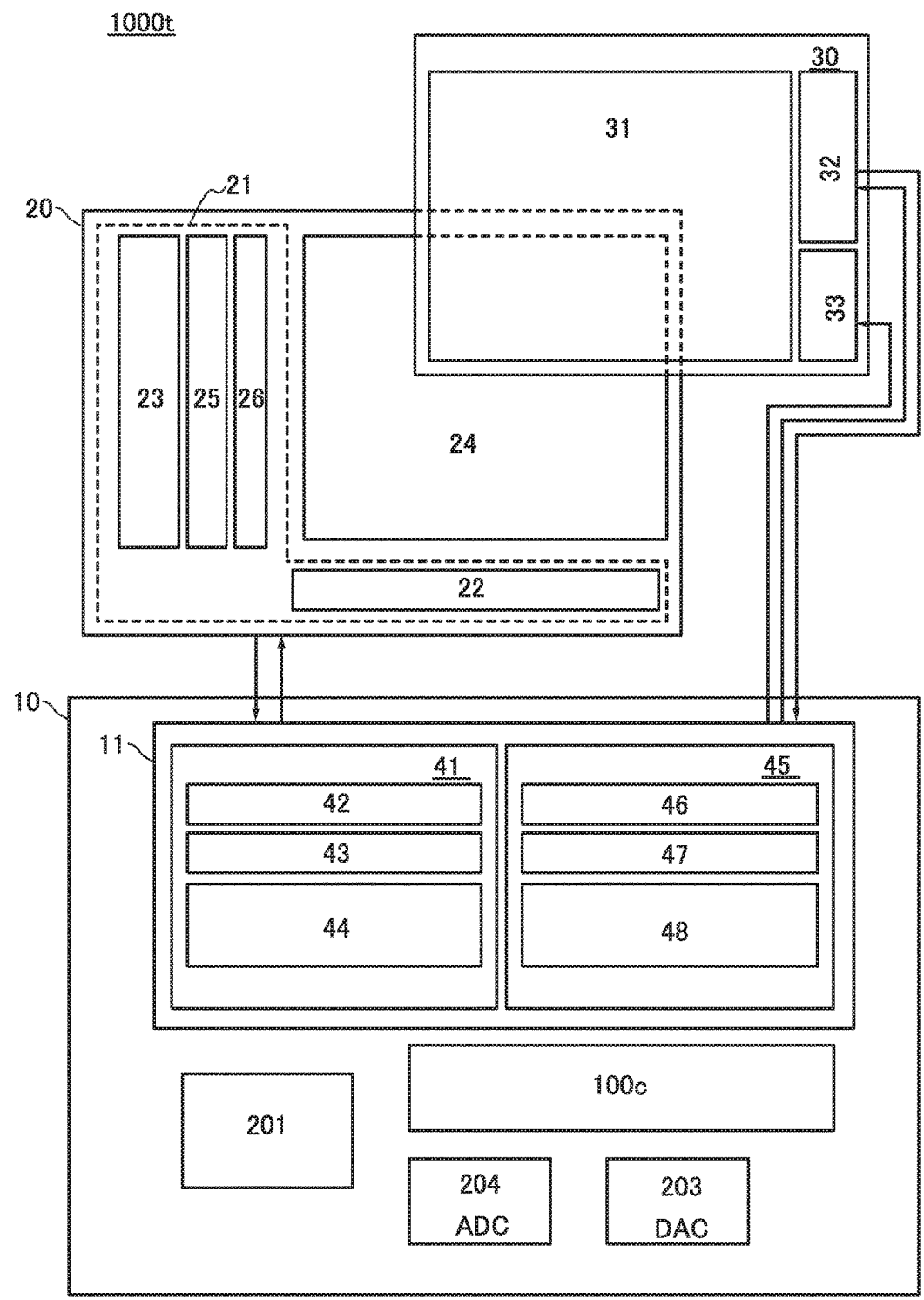
FIG. 10 is a block diagram illustrating a configuration example of a semiconductor device.

FIG. 10 illustrates the semiconductor device 1000t. The semiconductor device 1000t includes a control device 10, the display device 20, and a touch sensor unit 30.

The touch sensor unit 30 includes a sensor array 31, a sensing circuit 32, and a driving line driver circuit 33 (hereinafter referred to as a DRL driver circuit 33), each of which can be composed of a dedicated IC.

The control device 10 includes the processor 201, the signal generation circuit 11, the digital-analog converter circuit 203, the analog-digital converter circuit 204, and the power supply control circuit 100C. The signal generation circuit 11 includes a display controller 41 and a touch sensor (TS) controller 45.

The TS controller 45 is a controller for the touch sensor unit 30 and includes a memory 46, a timing controller 47, and a signal processing circuit 48. The timing controller 47 has a function of generating a variety of signals for setting the operation timing of the sensing circuit 32 and the DRL driver circuit 33. For example, the timing controller 47 generates a signal for controlling the sensing circuit 32 (e.g., a clock signal, a reset signal), a signal for controlling the DRL driver circuit 33 (e.g., a start pulse signal, a clock signal). The signal processing circuit 48 has a function of processing a signal output from the sensing circuit 32 and generating a signal containing touch data (data on whether a touch operation is performed), a signal containing touch position data, and the like.

The display device 20 includes a display unit 21 and a pixel portion 24. The display unit 21 includes the scan driver 22, the source driver 23, a current detection circuit 25, and a switch circuit 26. The display unit 21 can be composed of a dedicated IC.

The display controller 41 is a controller for the display device 20 and includes a memory 42, a timing controller 43, and an image processing circuit 44. The image processing circuit 44 can convert image data stored in the memory 42 into display data. The timing controller 43 controls a signal for controlling operation of the scan driver 22 (a clock signal, a reset signal, or the like) and the source driver in synchronization with the timing of the scan driver 22, whereby the display data can be written to the pixel portion 24.

As a format of the image data, a data format in storing an image as data, such as a BMP format, a JPEG format, or a TIFF format, is used. For example, the display data is preferably data obtained by eliminating header information or the like, which is meta information, from image data in a BMP format and converting the data into only RGB information displayed in the pixel portion.

The current detection circuit 25 converts current consumed by the scan driver 22, the source driver 23, the pixel portion 24, or the like of the display device 20 into a voltage for detection. That is, the function of monitoring the input-output terminal 300, which is described in Embodiments 3 to 5, is used.

Figure 11A:
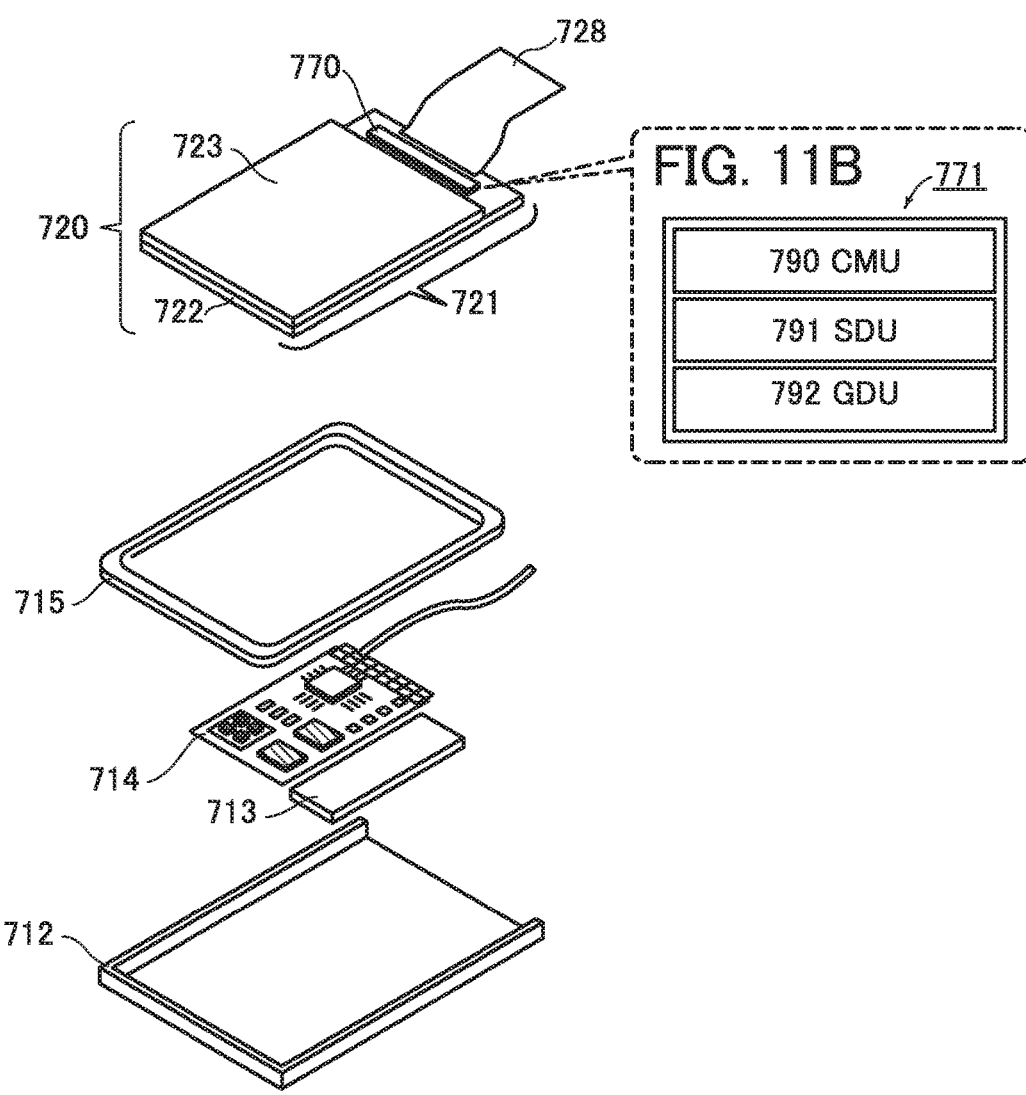

FIG. 11A is an exploded perspective view schematically illustrating a configuration example of a display device. A display device 700 illustrated in FIG. 11A includes an upper cover 711, a lower cover 712, a battery 713, a printed board 714, a frame 715, and a display unit 720. In some cases, the battery 713 or the like is not provided.

The printed circuit board 714 is provided with a processor, a power supply circuit, a memory, a controller, and the like. As a power supply that supplies power to the power supply circuit, an external commercial power supply or the battery 713 can be used. The frame 715 has a function of protecting the display unit 720 and a function of an electromagnetic shield for blocking electromagnetic waves generated by the operation of the printed board 714. The frame 715 may have a function of a radiator plate.

The display unit 720 includes a display panel 721, an FPC 728, and an SD-IC (source driver IC) 770. The display panel 721 includes an element substrate 722 and a counter substrate 723. The element substrate 722 includes a pixel array, a gate driver circuit, and a terminal portion. The counter substrate 723 includes a color filter and a black matrix, for example. The SD-IC 770 includes the semiconductor device in Embodiment 1. One or a plurality of SD-ICs 770 corresponding to the number of source lines in the pixel array is/are used.

The FPC 728 and the SD-IC 770 are electrically connected to the terminal portion provided in the element substrate 722 by a chip on glass (COG) method. Although the SD-IC 770 is mounted by a COG method here, there is no particular limitation on the mounting method, and a chip on flexible (COF) method, a tape automated bonding (TAB) method, or the like may be employed.

When a gate driver circuit is not provided in the element substrate 722, a gate driver IC is connected to the element substrate 722, for example. Instead of the SD-IC 770, a driver IC 771 illustrated in FIG. 11B may be connected to the element substrate 722. The driver IC 771 includes a current sensing unit (CMU) 790, a source driver unit (SDU) 791, and a gate driver unit (GDU) 792.

A base substrate of the element substrate 722 may be any substrate that can support transistors and the like included in the pixel array. For example, a support substrate used for fabricating the transistors in the pixel array (e.g., a glass substrate or a quartz substrate) or a substrate different from the support substrate is used as the base substrate of the element substrate 722.

Examples of the base substrate include a glass substrate, a quartz substrate, a plastic substrate, a metal substrate, a stainless steel substrate, a substrate containing stainless steel foil, a tungsten substrate, a substrate containing tungsten foil, a flexible substrate, a laminate film, paper containing a fibrous material, and a base film. Examples of a glass substrate include a barium borosilicate glass substrate, an aluminoborosilicate glass substrate, and a soda lime glass substrate. Examples of a flexible substrate include flexible synthetic resin substrates made of plastics typified by polyethylene terephthalate (PET), polyethylene naphthalate (PEN), and polyether sulfone (PES), and acrylic. Examples of a laminate film are a film made of polypropylene, polyester, polyvinyl fluoride, polyvinyl chloride, or the like, and an vapor-deposited inorganic film. Examples of a base film are base films formed using a polyester resin, a polyamide resin, a polyimide resin, an aramid resin, an epoxy resin, and paper.

A base substrate of the counter substrate 723 is preferably a substrate having a function of sealing a display element. As the base substrate of the counter substrate 723, a substrate similar to the base substrate of the element substrate 722 can be used. Alternatively, the base substrate of the counter substrate 723 can be an optical film (circularly polarizing film).

By using flexible substrates as the base substrates of the element substrate 722 and the counter substrate 723, the display panel 721 can be flexible.

Configuration examples of a touch panel device are described with reference to FIGS. 12A to 12C and FIGS. 13A to 13C.

Figure 12A:
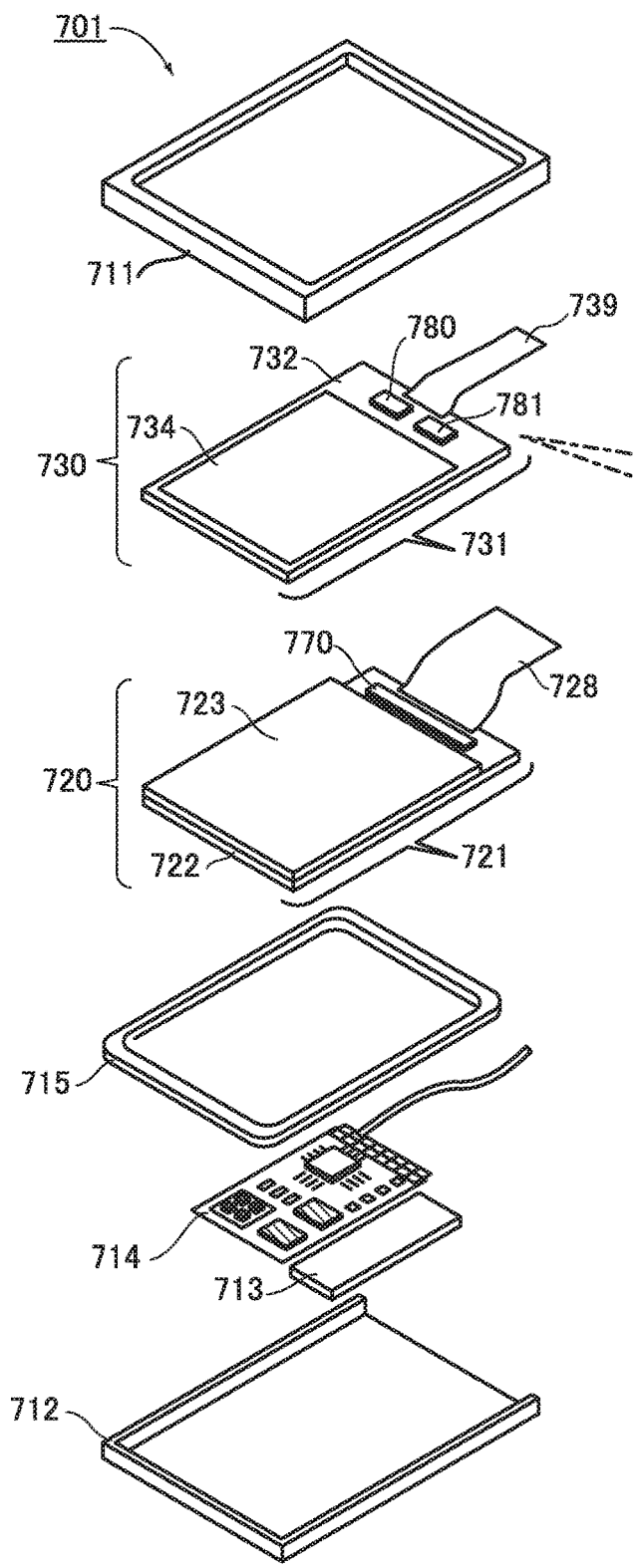
FIG. 12A is a schematic exploded perspective view illustrating a configuration example of a touch panel device and FIGS. 12B and 12C are each a block diagram illustrating a configuration example of a driver IC.
Figure 12B:
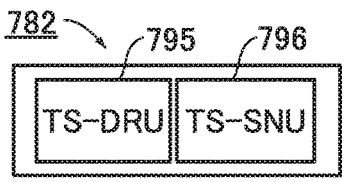
Figure 12C:
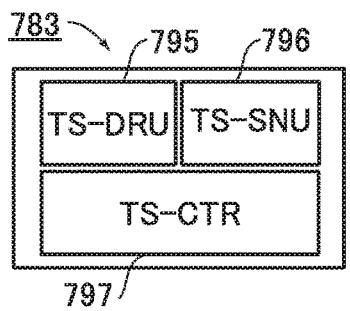

FIG. 12A is an exploded perspective view schematically illustrating a configuration example of a touch panel device including an out-cell touch panel unit. A touch panel device 701 illustrated in FIG. 12A is formed by incorporating a touch sensor unit 730 in the display device 700.

The touch sensor unit 730 includes a touch sensor panel 731, an FPC 739, a driving line driver IC (referred to as a "DRD-IC" in the following description) 780, and a sensing circuit SN-IC 781. The DRD-IC 780 is an IC having a function of a driving line driver circuit.

The touch sensor panel 731 includes a substrate 732. The substrate 732 is provided with a sensor array 734, a terminal portion, and the like. The FPC 739, the DRD-IC 780, and the SN-IC 781 are each electrically connected to the terminal portion of the substrate 732.

Instead of the DRD-IC 780 and the SN-IC 781, a driver IC 782 (FIG. 12B) or a driver IC 783 (FIG. 12C) may be used.

The driver IC 782 includes a TS-DRU 795 and a TS-SNU 796. The driver IC 783 includes the TS-DRU 795, the TS-SNU 796, and a TS-CTR 797. The TS-DRU 795 is a circuit unit functioning as a driving line driver circuit. The TS-SNU 796 is a circuit unit functioning as a sensing circuit. The TS-CTR 797 is a circuit unit functioning as a touch sensor controller.

In the example illustrated in FIG. 12A, the display panel 721 is a top-emission display panel. In the case where the display panel 721 is a bottom-emission display unit, the display unit 720 is provided so that the element substrate 722 is located on the upper cover 711 side.

Figure 13A:
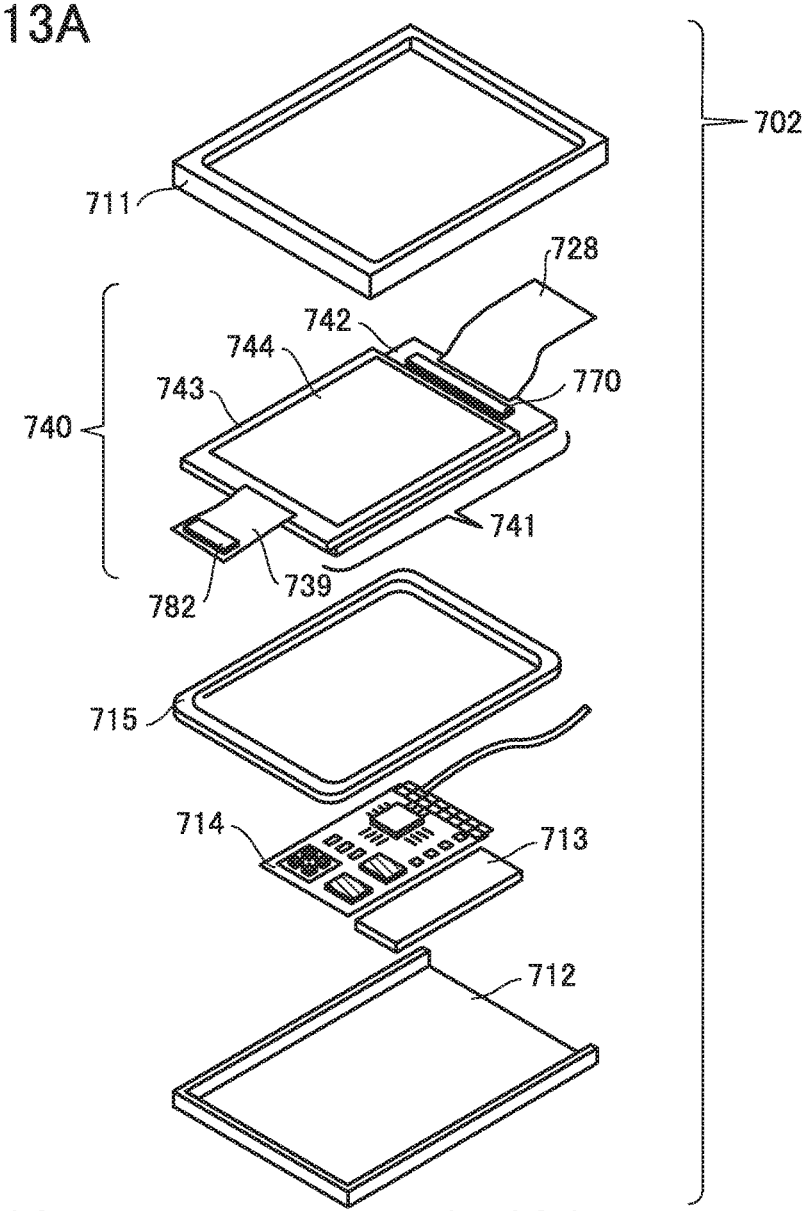
FIG. 13A is a schematic exploded perspective view illustrating a configuration example of a touch panel device and FIGS. 13B and 13C are each a perspective view illustrating a configuration example of a touch panel unit.

FIG. 13A is an exploded perspective view schematically illustrating a configuration example of a touch panel device. A touch panel device 702 illustrated in FIG. 13A includes a touch panel unit 740 instead of the display unit 720 and the touch sensor unit 730. The touch panel unit 740 is a unit that combines the display unit 720 and the touch sensor unit 730.

The touch panel unit 740 is an on-cell touch panel unit and includes a display panel 741, the FPC 728, the FPC 739, the SD-IC 770, and the driver IC 782.

The display panel 741 is a top-emission display panel. The display panel 741 includes an element substrate 742 and a counter substrate 743. The structure of the element substrate 742 is similar to that of the element substrate 722. The SD-IC 770 and a pixel array are electrically connected to the FPC 728. The counter substrate 743 includes a sensor array 744 and a terminal portion connected to the sensor array 744. The sensor array 744 and the terminal portion are placed on an exterior surface of the counter substrate 743. The FPC 739 is connected to the terminal portion, and the driver IC 782 is electrically connected to the FPC 739.

Instead of the driver IC 782, the driver IC 783 may be provided, or the DRD-IC 780 and the SN-IC 781 may be provided.

Figure 13B:
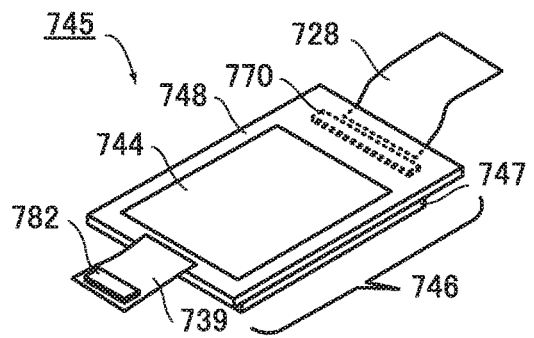
Figure 13C:
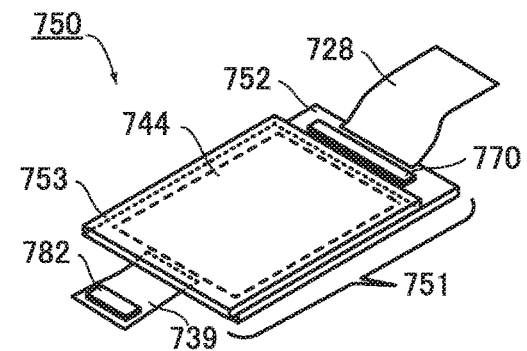

FIGS. 13B and 13C each illustrate another configuration example of a touch panel unit. A touch panel unit 745 illustrated in FIG. 13B is an on-cell display panel unit. The touch panel unit 745 includes a display panel 746, the FPCs 728 and 739, the SD-IC 770, and the driver IC 782. The display panel 746 is a bottom-emission display panel and includes an element substrate 747 and a counter substrate 748. The sensor array 744 and a terminal portion electrically connected to the sensor array 744 are provided on an exterior surface of the counter substrate 748. The FPC 739 is electrically connected to the terminal portion.

A touch panel unit 750 illustrated in FIG. 13C is an in-cell display panel unit. The touch panel unit 750 includes a display panel 751, the FPCs 728 and 739, the SD-IC 770, and the driver IC 782. The display panel 751 is a top-emission display panel and includes an element substrate 752 and a counter substrate 753. The element substrate 752 has a structure similar to that of the element substrate 722. The sensor array 744 and a terminal portion electrically connected to the sensor array are provided on an interior surface of the counter substrate 753 (a surface that faces the element substrate 752). The FPC 739 is electrically connected to the terminal portion, and the driver IC 782 is electrically connected to the FPC 739. Note that the structure and method described in this embodiment can be implemented by being combined as appropriate with any of the other structures and methods described in the other embodiments.

Embodiment 7

In this embodiment, configuration examples of a display panel are described with reference to FIG. 14, FIGS. 15A and 15B, and FIG. 16.

Figure 14:
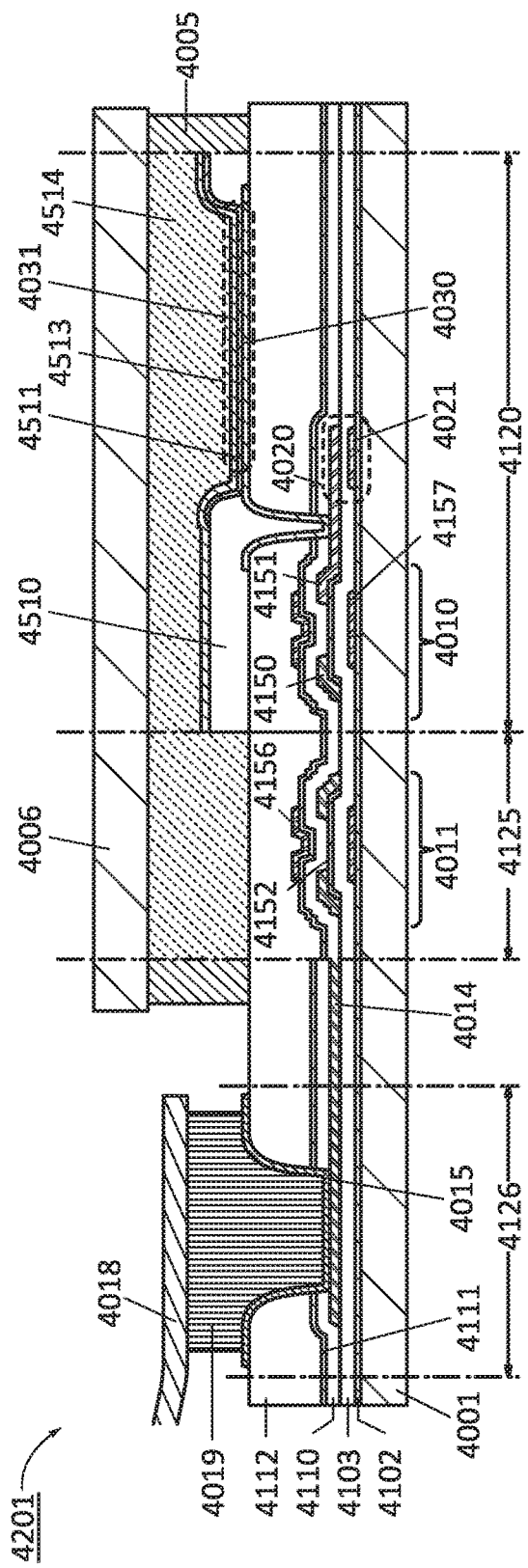
FIG. 14 is a cross-sectional view illustrating a configuration example of a display panel.

In a display panel 4201 illustrated in FIG. 14, a substrate 4001 is a base substrate of an element substrate, and a substrate 4006 is a base substrate of a counter substrate.

The substrate 4001 is provided with a pixel array 4120, a gate driver circuit 4125, and a terminal portion 4126. In FIG. 14, a transistor 4010, a capacitor 4020, and an EL element 4513 included in the pixel array 4120 and a transistor 4011 included in the gate driver circuit 4125 are illustrated as an example. Over the substrate 4001, insulating layers 4102, 4103, 4110, 4111, and 4112 are provided.

The transistors 4010 and 4011 are provided over the insulating layer 4102. The transistors 4010 and 4011 each include conductive layers 4150 and 4151, a semiconductor layer 4152, and conductive layers 4156 and 4157. The conductive layer 4157 has a function of a gate electrode, the conductive layers 4150 and 4151 function as a source electrode and a drain electrode, and the conductive layer 4156 functions as a backgate electrode.

The capacitor 4020 includes a region where the conductive layer 4151 and a conductive layer 4021 overlap with each other with the insulating layer 4103 sandwiched therebetween.

The terminal portion 4126 is provided with conductive layers 4014 and 4015. The conductive layer 4015 is electrically connected to a terminal included in an FPC 4018 through an anisotropic conductive layer 4019. The conductive layer 4015 is electrically connected to the conductive layer 4014. The conductive layer 4014 functions as a terminal, and the conductive layer 4015 functions as a lead wiring.

The semiconductor layer 4152 includes a channel formation region. As a semiconductor material of the semiconductor layer 4152, crystalline silicon, polycrystalline silicon, amorphous silicon, an oxide semiconductor, an organic semiconductor, or the like can be used. If necessary, an impurity may be added into the semiconductor layer 4152 in order to increase the conductivity of the semiconductor layer 4152 or control the threshold voltage of the transistor.

In the case where the semiconductor layer 4152 is an oxide semiconductor layer, for example, a metal oxide containing at least one of indium (In) and zinc (Zn) is preferably used. Typical examples of such a metal oxide include an In oxide, a Zn oxide, an In—Zn oxide, and an In-M-Zn oxide (element M is Al, Ti, Ga, Y, Zr, La, Ce, Nd, or Hf).

A conductive layer 4030 is provided over the insulating layer 4112. A partition wall 4510 is provided over the conductive layer 4030 and the insulating layer 4112. A light-emitting layer 4511 and a conductive layer 4031 are stacked over the partition wall 4510. A partition wall 4510 can be formed using an organic insulating material or an inorganic insulating material. It is particularly preferable that the partition wall be formed using a photosensitive resin material to have an opening over the conductive layer 4030 so that a side surface of the opening is formed as an inclined surface with continuous curvature.

The EL element 4513 is formed of stacked layers of the conductive layer 4030, the light-emitting layer 4511, and the conductive layer 4031. One of the conductive layers 4030 and 4031 functions as an anode of the EL element 4513, and the other functions as a cathode. The conductive layer 4030 functions as a pixel electrode and is electrically connected to the conductive layer 4151 of the transistor 4010. The light-emitting layer 4511 may be a single layer or stacked layers.

A protective layer may be formed over the conductive layer 4031 and the partition wall 4510 in order to prevent entry of oxygen, hydrogen, moisture, carbon dioxide, or the like into the EL element 4513. For the protective layer, silicon nitride, silicon nitride oxide, aluminum oxide, aluminum nitride, aluminum oxynitride, aluminum nitride oxide, diamond like carbon (DLC), or the like can be used.

The substrate 4006 is fixed to the substrate 4001 with a sealant 4005. A space sealed by the sealant 4005 between the substrate 4001 and the substrate 4006 is filled with a filler 4514. As the filler 4514, an ultraviolet curable resin or a thermosetting resin can be used as well as an inert gas such as nitrogen or argon; for example, polyvinyl chloride (PVC), an acrylic resin, polyimide, an epoxy resin, a silicone resin, polyvinyl butyral (PVB), ethylene vinyl acetate (EVA), or the like can be used. A drying agent may be contained in the filler 4514. For example, a glass material such as a glass frit, or a resin that is curable at room temperature such as a two-component-mixture-type resin, a light curable resin, a thermosetting resin, and the like can be used for the sealant 4005. A drying agent may be contained in the sealant 4005.

A color filter layer, a black matrix layer, a polarizing plate, a circularly polarizing plate (including an elliptically polarizing plate), a retardation plate (a quarter-wave plate or a half-wave plate), or the like may be provided as appropriate. These components may be provided on the substrate 4006 side if the display panel 4201 is of a top-emission type, and provided on the substrate 4001 side if the display panel 4201 is of a bottom-emission type.

FIGS. 15A and 15B each illustrate another configuration example of a display panel. A display panel 4202 illustrated in FIG. 15A and a display panel 4203 illustrated in FIG. 15B are different from the display panel 4201 in transistor structure. The transistors 4010 and 4011 in the display panel 4202 are of a top-gate type. The transistors 4010 and 4011 in the display panel 4203 are of a top-gate type with a back gate electrode.

Figure 16:
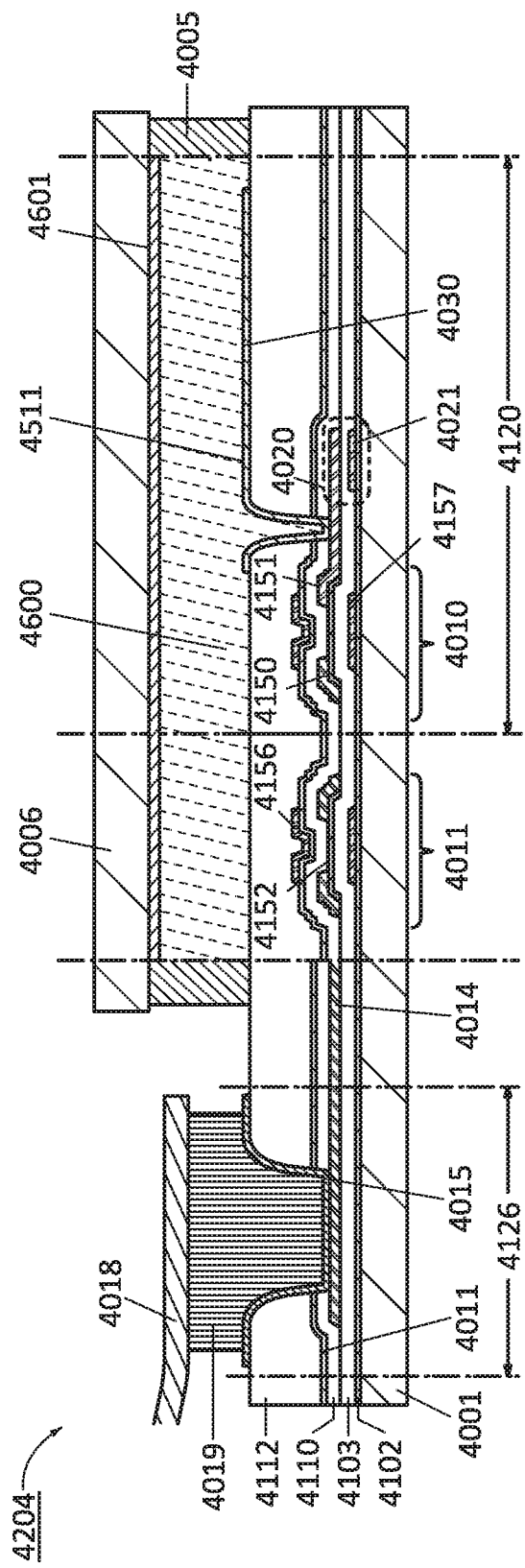
FIG. 16 is a cross-sectional view illustrating a configuration example of a display panel.

FIG. 16 illustrates another configuration example of a display panel. A display panel 4204 illustrated in FIG. 16 differs from the display panels 4202 and 4203 in a structure of a transistor. The transistors 4010 and 4011 in the display panel 4202 are of a top-gate type. The transistors 4010 and 4011 in the display panel 4203 are of a top-gate type with a back gate electrode.

In a display panel 4204 illustrated in FIG. 16, a substrate 4001 is a base substrate of an element substrate, and a substrate 4006 is a base substrate of a counter substrate.

The display panel 4204 in FIG. 16 differs from the display panel 4201 in FIG. 14 in that an LC element 4600 and a counter electrode 4601 are included. Note that the structure and method described in this embodiment can be implemented by being combined as appropriate with any of the other structures and methods described in the other embodiments.

Embodiment 8

In this embodiment, an IC chip, an electronic component, electronic devices, and the like are described as examples of a semiconductor device.

<Example of Manufacturing Method of Electronic Component>

FIG. 17A is a flow chart showing an example of a method for manufacturing an electronic component. The electronic component is also referred to as a semiconductor package or an IC package. This electronic component has a plurality of standards and names depending on a terminal extraction direction and a terminal shape. Examples of the electronic component are described in this embodiment.

A semiconductor device including a transistor is completed by integrating detachable components on a printed wiring board through an assembly process (post-process). The post-process can be finished through steps in FIG. 17A. Specifically, after an element substrate obtained in a wafer process is completed (Step ST71), a rear surface of the substrate is ground. The substrate is thinned in this step to reduce warpage or the like of the substrate in the wafer process and to reduce the size of the electronic component. Next, the substrate is divided into a plurality of chips in a dicing step (Step ST72).

FIG. 17B is a top view illustrating a semiconductor wafer 7100 before a dicing process. FIG. 17C is an enlarged view of part of FIG. 17B. A plurality of circuit regions 7102 is provided in the semiconductor wafer 7100. A semiconductor device of one embodiment of the present invention (e.g., a memory device, an imaging device, or an MCU) is provided in the circuit region 7102.

The plurality of circuit regions 7102 are each surrounded by a separation region 7104. Separation lines (also referred to as "dicing lines") 7106 are set at a position overlapping with the separation regions 7104. In the dicing process (ST72), the semiconductor wafer 7100 can be cut along the separation lines 7106 into chips 7110 including the circuit regions 7102. FIG. 17D is an enlarged view of the chip 7110.

A conductive layer or a semiconductor layer may be provided in the separation regions 7104. Providing a conductive layer or a semiconductor layer in the separation regions 7104 relieves ESD that might be caused in a dicing step, preventing a decrease in the yield due to the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation regions 7104 allows a reduction in the usage of the pure water. Therefore, the cost of manufacturing semiconductor devices can be reduced. Thus, semiconductor devices can be manufactured with improved productivity.

After Step ST72, the divided chips are separately picked up to be mounted on and bonded to a lead frame in a die bonding step (Step ST73). In the die bonding step, the chip is bonded to the lead frame by an appropriate method depending on a product, for example, bonding with a resin or a tape. In the die bonding step, the chip may be mounted on an interposer to be bonded. In a wire bonding step, lead of the lead frame is electrically connected to an electrode on the chip with a metal fine line (wire) (Step ST74). A silver line or a gold line can be used as the metal fine line. Either ball bonding or wedge bonding may be used as wire bonding.

A molding step is performed to seal the wire bonded chip with an epoxy resin or the like (Step ST75). With the molding step, the electronic component is filled with the resin, so that damage to a mounted circuit portion or wire due to mechanical external force can be reduced. Furthermore, degradation in characteristics due to moisture or dust can be reduced. The lead of the lead frame is plated. After that, the lead is cut and processed (Step ST76). This plating step prevents rust of the lead and facilitates soldering at the time of mounting the chip on a printed wiring board in a later step. Printing (marking) is performed on a surface of the package (Step ST77). Through an inspection step (Step ST78), the electronic component is completed (Step ST79). When the electronic component includes the semiconductor device described in the above embodiment, a low-power small electronic component can be provided.

FIG. 17E is a schematic perspective view of the completed electronic component. FIG. 17E illustrates a schematic perspective view of a quad flat package (QFP) as an example of the electronic component. As illustrated in FIG. 17E, an electronic component 7000 includes a lead 7001 and a chip 7110.

The electronic component 7000 is mounted on a printed wiring board 7002, for example. When a plurality of electronic components 7000 are used in combination and electrically connected to each other over the printed wiring board 7002, the electronic components 7000 can be mounted on an electronic device. A completed circuit board 7004 is provided in the electronic device or the like. When an electronic device includes the electronic component 7000, the power consumption of the electronic device can be reduced. Alternatively, the electronic device can have smaller size.

The electronic component 7000 can be used as an electronic component (IC chip) of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), cellular phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATM), vending machines, and consumer electronics.

Configuration examples of electronic devices are described below with reference to FIGS. 18A to 18C and FIGS. 19A to 19E. A touch panel device including a touch sensor is preferably used for a display portion of each of the electronic devices in FIG. 18A and the like. With the touch panel device, the display portion can also function as an input portion of the electronic device.

Figure 18A:
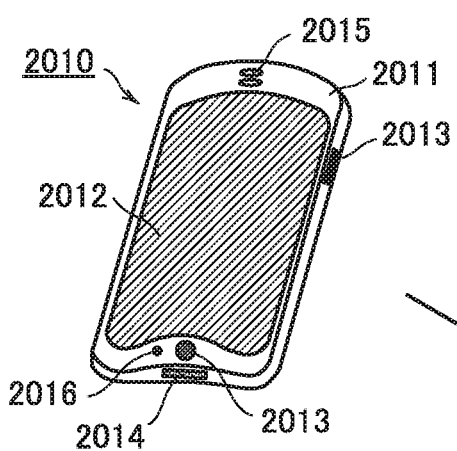
FIGS. 18A to 18C illustrate configuration examples of electronic devices.

An information terminal 2010 in FIG. 18A includes a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be input by touching the display portion 2012 with a finger or the like. Various operations such as making a phone call, inputting characters, and screen switching of the display portion 2012 can be performed by touching the display portion 2012 with a finger or the like. The information terminal 2010 can be operated by inputting sound from the microphone 2016. Power on/off operation, screen switching of the display portion 2012, and the like can be performed by pressing the operation button 2013.

Figure 18B:
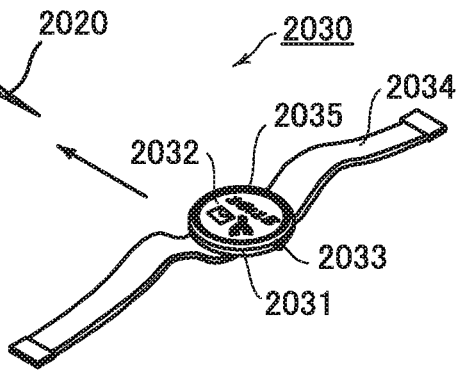

FIG. 18B illustrates an example of a watch-type information terminal. An information terminal 2030 includes a housing 2031, a display portion 2032, a winding crown 2033, a belt 2034, and a sensing unit 2035. The information terminal 2030 can be operated by rotating the winding crown 2033. The information terminal 2030 can be operated by touching the display portion 2032 with a finger.

The sensing unit 2035 has a function of obtaining information on usage environment and biological information. The sensing unit 2035 may be provided with a microphone, an imaging element, an acceleration sensor, a direction sensor, a pressure sensor, a temperature sensor, a humidity sensor, an illumination sensor, a positioning sensor (e.g., a global positioning system (GPS)), or the like.

Wireless communication devices with the same standard may be incorporated into the information terminal 2010 and the information terminal 2030 so that interactive communication is possible through a wireless signal 2020. When the information terminal 2010 receives an incoming e-mail or call, for example, information notifying the incoming e-mail or call can be displayed on the display portion 2032 of the information terminal 2030.

Figure 18C:
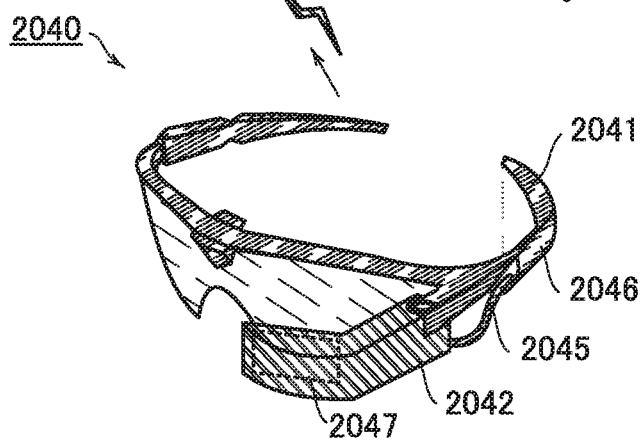

FIG. 18C illustrates an example of a glasses-type information terminal. An information terminal 2040 includes a mounting portion 2041, a housing 2042, a cable 2045, a battery 2046, and a display portion 2047. The battery 2046 is stored in the mounting portion 2041. The display portion 2047 is provided in the housing 2042. The housing 2042 includes a processor, a wireless communication device, a storage device, and a variety of electronic components.

Power is supplied from the battery 2046 to the display portion 2047 and the electronic components in the housing 2042 through the cable 2045. A variety of information such as an image or the like transmitted wirelessly is displayed on the display portion 2047.

The housing 2042 may be provided with a camera. The information terminal 2040 can be operated by sensing movement of a user's eyeball or eyelid with the camera.

The mounting portion 2041 may be provided with a variety of sensors such as a temperature sensor, a pressure sensor, an acceleration sensor, and a biological sensor. For example, the biological sensor obtains biological information about the user and then stores the biological information in the storage device of the housing 2042. Interactive communication between the information terminal 2010 and the information terminal 2040 is possible through a wireless signal 2021, for example. The information terminal 2040 transmits the stored biological information to the information terminal 2010. The information terminal 2010 calculates the degree of fatigue, the amount of activity, and the like of the user from the received biological information.

Figure 19A:
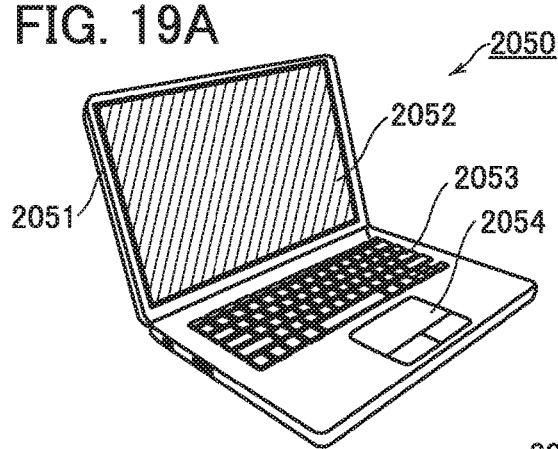
FIGS. 19A to 19E illustrate configuration examples of electronic devices.

A laptop 2050 in FIG. 19A includes a housing 2051, a display portion 2052, a keyboard 2053, and a pointing device 2054. The laptop 2050 can be operated by touch operation of the display portion 2052.

Figure 19B:
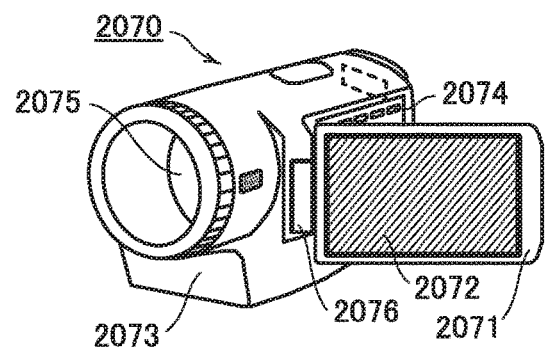

A video camera 2070 in FIG. 19B includes a housing 2071, a display portion 2072, a housing 2073, an operation key 2074, a lens 2075, and a joint 2076. The display portion 2072 is provided in the housing 2071. The operation key 2074 and the lens 2075 are provided in the housing 2073. The housing 2071 and the housing 2073 are connected to each other with the joint 2076, and the angle between the housing 2071 and the housing 2073 can be changed with the joint 2076. Images on the display portion 2072 may be switched in accordance with the angle between the housing 2071 and the housing 2073 at the joint 2076. Various operations such as starting or stopping video recording, magnification and zoom adjustment, and changing a shooting range can be performed by touch operation of the display portion 2072.

Figure 19C:
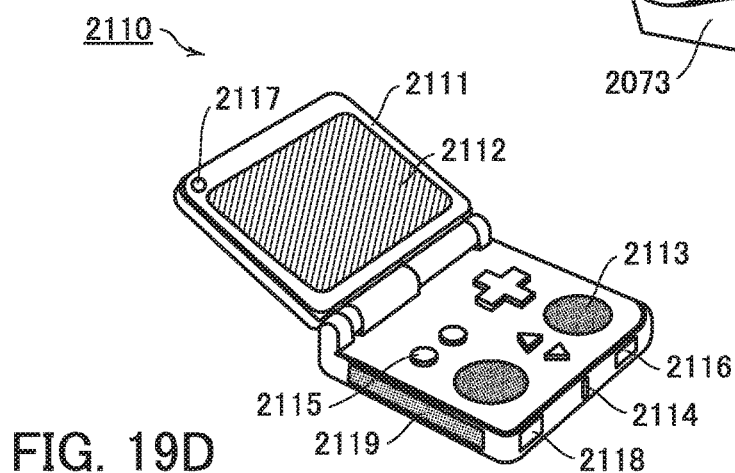

A portable game machine 2110 in FIG. 19C includes a housing 2111, a display portion 2112, speakers 2113, an LED lamp 2114, operation key buttons 2115, a connection terminal 2116, a camera 2117, a microphone 2118, and a recording medium read portion 2119.

Figure 19D:
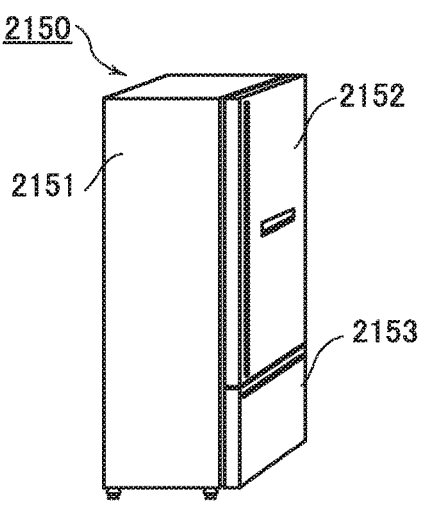

An electric refrigerator-freezer 2150 in FIG. 19D includes a housing 2151, a refrigerator door 2152, a freezer door 2153, and the like.

Figure 19E:
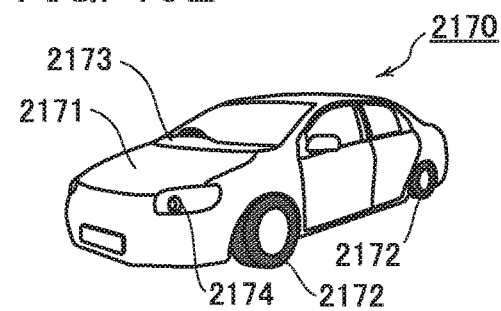

A motor vehicle 2170 in FIG. 19E includes a car body 2171, wheels 2172, a dashboard 2173, lights 2174, and the like. The processor in Embodiment 2 is used as each of processors in the motor vehicle 2170. Note that the structure and method described in this embodiment can be implemented by being combined as appropriate with any of the other structures and methods described in the other embodiments.

Embodiment 9

In this embodiment, an oxide semiconductor and the like are described.
<Configuration Example 1 of OS Transistor>
FIG. 20A is a top view illustrating a configuration example of an OS transistor. FIG. 20B is a cross-sectional view taken along line X1-X2 in FIG. 20A. FIG. 20C is a cross-sectional view taken along line Y1-Y2 in FIG. 20A. In some cases, the direction of line X1-X2 is referred to as a channel length direction, and the direction of line Y1-Y2 is referred to as a channel width direction. Accordingly, FIG. 20B illustrates a cross-sectional structure of the OS transistor in the channel length direction, and FIG. 20C illustrates a cross-sectional structure of the OS transistor in the channel width direction. Note that to clarify the device structure, FIG. 20A does not illustrate some components.

An OS transistor 501 is formed over an insulating surface, here, over an insulating layer 521. The OS transistor 501 is covered with insulating layers 528 and 529. The OS transistor 501 includes insulating layers 522 to 527, metal oxide layers 511 to 513, and conductive layers 550 to 553.

Note that an insulating layer, a metal oxide layer, a conductor, and the like in a drawing may have a single-layer structure or a layered structure. These elements can be formed by any of a variety of deposition methods such as sputtering, molecular beam epitaxy (MBE), pulsed laser ablation (PLA), CVD, and atomic layer deposition (ALD). Examples of CVD include plasma-enhanced CVD, thermal CVD, and metal organic CVD.

The metal oxide layers 511 to 513 are collectively referred to as an oxide layer 510. As illustrated in FIGS. 20B and 20C, the oxide layer 510 includes a portion where the metal oxide layer 511, the metal oxide layer 512, and the metal oxide layer 513 are stacked in that order. When the OS transistor 501 is on, a channel is mainly formed in the metal oxide layer 512 of the oxide layer 510.

A gate electrode of the OS transistor 501 is formed using the conductive layer 550. A pair of electrodes that functions as a source electrode and a drain electrode of the OS transistor 501 is formed using the conductive layers 551 and 552. A back gate electrode of the OS transistor 501 is formed using the conductive layer 553. The conductive layer 553 includes conductive layers 553a and 553b. Note that the OS transistor 501 does not necessarily include a back gate electrode. The same applies to OS transistors 502 to 507 to be described later.

A gate insulating layer on a gate (front gate) side is formed using the insulating layer 527. A gate insulating layer on a back gate side is formed using a stack of the insulating layers 524 to 526. The insulating layer 528 is an interlayer insulating layer. The insulating layer 529 is a barrier layer.

The metal oxide layer 513 covers a stack of the metal oxide layers 511 and 512 and the conductive layers 551 and 552. The insulating layer 527 covers the metal oxide layer 513. The conductive layers 551 and 552 each include a region that overlaps with the conductive layer 550 with the metal oxide layer 513 and the insulating layer 527 positioned therebetween.

The conductive layers 551 and 552 are formed using a hard mask used for forming the stack of the metal oxide layers 511 and 512. For example, the metal oxide layers 511 and 512 and the conductive layers 551 and 552 can be formed through the following steps. A two-layer metal oxide film is formed. A conductive film is formed over the metal oxide film. This conductive film is etched, so that a hard mask is formed. With the use of this hard mask, the two-layer metal oxide film is etched to form the stack of the metal oxide layers 511 and 512. Then, the hard mask is etched to form the conductive layers 551 and 552. Since the conductive layers 551 and 552 are formed through these steps, the conductive layers 551 and 552 do not include regions that are in contact with side surfaces of the metal oxide layers 511 and 512.

(Conductive Layer)

Examples of a conductive material used for the conductive layers 550 to 553 include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

With the use of a conductive material with a high work function for the conductive layer 550, it is possible to increase Vt of the OS transistor 501 and reduce cutoff current. For the conductive layer 550, a conductive material whose work function is preferably higher than or equal to 4.8 eV, more preferably higher than or equal to 5.0 eV, still more preferably higher than or equal to 5.2 eV, yet more preferably higher than or equal to 5.4 eV, still more preferably higher than or equal to 5.6 eV can be used. Examples of the conductive material with a high work function include molybdenum, molybdenum oxide, Pt, Pt silicide, Ni silicide, indium tin oxide, and an In—Ga—Zn oxide to which nitrogen is added.

Note that the cutoff current refers to drain current at gate-source voltage=0 V.

For example, the conductive layer 550 is a single layer of tantalum nitride or tungsten. Alternatively, in the case where the conductive layer 550 has a two-layer structure or a three-layer structure, the following combinations can be used: aluminum and titanium; titanium nitride and titanium; titanium nitride and tungsten; tantalum nitride and tungsten; tungsten nitride and tungsten; titanium, aluminum, and titanium; titanium nitride, aluminum, and titanium; and titanium nitride, aluminum, and titanium nitride. The conductor described first is used for a layer on the insulating layer 527 side.

The conductive layers 551 and 552 have the same layer structure. For example, in the case where the conductive layer 551 is a single layer, any of metals such as aluminum, titanium, chromium, nickel, copper, yttrium, zirconium, molybdenum, silver, tantalum, and tungsten, or an alloy containing any of these metals as its main component may be used. Alternatively, in the case where the conductive layer 551 has a two-layer structure or a three-layer structure layer, the following combinations can be used: titanium and aluminum; tungsten and aluminum; tungsten and copper; a copper-magnesium-aluminum alloy and copper; a titanium film and copper; titanium or titanium nitride, aluminum or copper, and titanium or titanium nitride; and molybdenum or molybdenum nitride, aluminum or copper, and molybdenum or molybdenum nitride. The conductor described first is used for a layer on the insulating layer 527 side.

For example, it is preferable that the conductive layer 553a be a conductive layer that has a hydrogen barrier property (e.g., a tantalum nitride layer) and that the conductive layer 553b be a conductive layer that has higher conductivity than the conductive layer 553a (e.g., a tungsten layer). With such a structure, the conductive layer 553 functions as a wiring and has a function of suppressing diffusion of hydrogen into the oxide layer 510.

(Insulating Layer)

Examples of insulating materials used for the insulating layers 521 to 529 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 521 to 529 are formed using a single-layer structure or a layered structure of these insulating materials. The layers used for the insulating layers 521 to 529 may include a plurality of insulating materials.

Note that in this specification and the like, an oxynitride refers to a substance that contains more oxygen than nitrogen, and a nitride oxide refers to a substance that contains more nitrogen than oxygen.

In order to suppress the increase in oxygen vacancies in the oxide layer 510, the insulating layers 526 to 528 preferably include oxygen. More preferably, at least one of the insulating layers 526 to 528 is formed using an insulating film from which oxygen is released by heating (hereinafter such an insulating film is referred to as an insulating film containing excess oxygen). When oxygen is supplied from the insulating film containing excess oxygen to the oxide layer 510, the oxygen vacancies in the oxide layer 510 can be compensated. Thus, reliability and electrical characteristics of the OS transistor 501 can be improved.

The insulating film containing excess oxygen is a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than or equal to $3.0 \times 10^{20}$ molecules/cm$^3$.

The insulating film containing excess oxygen can be formed by performing treatment for adding oxygen to an insulating film. The treatment for adding oxygen can be performed by heat treatment in an oxygen atmosphere, ion implantation, ion doping, plasma immersion ion implantation, plasma treatment, or the like. As a gas for adding oxygen, an oxygen gas of $^{16}O_2$, $^{18}O_2$, or the like, a nitrous oxide gas, an ozone gas, or the like can be used.

The concentration of hydrogen in the insulating layers 521 to 529 is preferably low in order to prevent the increase in the concentration of hydrogen in the oxide layer 510. In particular, the concentration of hydrogen in the insulating layers 523 to 528 is preferably low. Specifically, the concentration of hydrogen is lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$.

The concentration of nitrogen in the insulating layers 523 to 528 is preferably low in order to prevent the increase in the concentration of nitrogen in the oxide layer 510. Specifically, the concentration of nitrogen is lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

The hydrogen concentration and the nitrogen concentration are measured by secondary ion mass spectrometry (SIMS).

In the OS transistor 501, the oxide layer 510 is preferably surrounded by an insulating layer with oxygen and hydrogen barrier properties (hereinafter such an insulating layer is referred to as a barrier layer). With such a structure, it is possible to suppress the release of oxygen from the oxide layer 510 and entry of hydrogen into the oxide layer 510;

thus, the reliability and electrical characteristics of the OS transistor 501 can be improved.

For example, the insulating layer 529 functions as a barrier layer and at least one of the insulating layers 521, 522, and 524 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride.

In addition, a barrier layer may be provided between the oxide layer 510 and the conductive layer 550. Alternatively, a metal oxide layer that has oxygen and hydrogen barrier properties may be provided as the metal oxide layer 513.

The film thicknesses of the insulating layer 524, the insulating layer 525, and the insulating layer 526 are preferably reduced so that the threshold voltage of the OS transistor can be easily controlled with the voltage of the conductive layer 550. For example, the film thicknesses of the insulating layers 524 to 526 are each smaller than or equal to 50 nm. The film thicknesses of the insulating layers 524 to 526 are each preferably smaller than or equal to 30 nm, more preferably smaller than or equal to 10 nm, still more preferably smaller than or equal to 5 nm.

A configuration example of the insulating layers 521 to 529 is described. In this example, each of the insulating layers 521, 522, 525, and 529 functions as a barrier layer. The insulating layers 526 to 528 are oxide layers containing excess oxygen. The insulating layer 521 is formed using silicon nitride. The insulating layer 522 is formed using aluminum oxide. The insulating layer 523 is formed using silicon oxynitride. The gate insulating layers (524 to 526) on the back gate side are formed using a stack of silicon oxide, aluminum oxide, and silicon oxide. The gate insulating layer (527) on the front gate side is formed using silicon oxynitride. The interlayer insulating layer (528) is formed using silicon oxide. The insulating layer 529 is formed using aluminum oxide.

(Metal Oxide Layer)

The thickness of each of the metal oxide layers 511 to 513 is larger than or equal to 3 nm and smaller than or equal to 500 nm, preferably larger than or equal to 3 nm and smaller than or equal to 100 nm, more preferably larger than or equal to 3 nm and smaller than or equal to 60 nm.

In order to reduce the off-state current of the OS transistor 501, for example, the energy gap of the metal oxide layer 512 is preferably large. The energy gap of the metal oxide layer 512 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The oxide layer 510 is preferably a crystalline metal oxide layer. At least the metal oxide layer 512 is preferably a crystalline metal oxide layer. The OS transistor 501 can have high reliability and favorable electrical characteristics.

As the oxide of the metal oxide layer 512, typically, an In—Ga oxide, an In—Zn oxide, or an In-M-Zn oxide (M is Al, Ga, Y, or Sn) can be used. The metal oxide layer 512 is not limited to the oxide layer containing indium. The metal oxide layer 512 can be formed using a Zn—Sn oxide, a Ga—Sn oxide, or a Zn—Mg oxide, for example. The metal oxide layers 511 and 513 can be formed using an oxide that is similar to the oxide of the metal oxide layer 512. The metal oxide layers 511 and 513 can be formed using a Ga oxide. In that case, the metal oxide layer 512 is preferably a metal oxide layer containing Ga.

When an interface state is formed at an interface between the metal oxide layer 512 and the metal oxide layer 511, a channel region is also formed in a region close to the interface; thus, the threshold voltage of the OS transistor 501 varies. It is preferable that the metal oxide layer 511 contains at least one of the metal elements contained in the metal oxide layer 512. Accordingly, an interface state is hardly formed at the interface between the metal oxide layer 512 and the metal oxide layer 511, and variations in the electrical characteristics of the OS transistor 501, such as the threshold voltage, can be reduced.

The metal oxide layer 513 preferably contains at least one of the metal elements contained in the metal oxide layer 512 because interface scattering is unlikely to occur at the interface between the metal oxide layer 512 and the metal oxide layer 513, and carrier transfer is not inhibited. Thus, the field-effect mobility of the OS transistor 501 can be increased.

It is preferable that the metal oxide layer 512 have the highest carrier mobility among the metal oxide layers 511 to 513. Accordingly, a channel can be formed in the metal oxide layer 512 that is apart from the insulating layers 526 and 527.

For example, in a metal oxide containing In such as an In-M-Zn oxide, carrier mobility can be increased by an increase in the In content. In the In-M-Zn oxide, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as an oxide semiconductor film, so that carrier mobility can be increased.

For example, the metal oxide layer 512 is formed using an In—Ga—Zn oxide, and the metal oxide layers 511 and 513 are formed using a Ga oxide. For example, in the case where the metal oxide layers 511 to 513 are formed using an In-M-Zn oxide, the metal oxide layer 511 has the highest In content among the metal oxide layers 511 to 513. In the case where the In-M-Zn oxide is formed by sputtering, the In content can be changed by a change in the atomic ratio of metal elements of a target.

For example, it is preferable that the atomic ratio of metal elements of a target used for depositing the metal oxide layer 512 be In:M:Zn=1:1:1, 3:1:2, or 4:2:4.1. For example, it is preferable that the atomic ratio of metal elements of a target used for depositing the metal oxide layers 511 and 513 be In:M:Zn=1:3:2 or 1:3:4. The atomic ratio of an In-M-Zn oxide deposited using a target of In:M:Zn=4:2:4.1 is approximately In:M:Zn=4:2:3.

In order that the OS transistor 501 have stable electrical characteristics, it is preferable to reduce the concentration of impurities in the oxide layer 510. In the metal oxide, hydrogen, nitrogen, carbon, silicon, and a metal element other than a main component are impurities. For example, hydrogen and nitrogen form donor levels to increase the carrier density, and silicon and carbon form impurity levels in the oxide semiconductor. The impurity levels serve as traps and might cause deterioration in the electric characteristics of the transistor.

For example, the oxide layer 510 includes a region where the concentration of silicon is lower than or equal to $2\times10^{18}$ atoms/cm$^3$, preferably lower than or equal to $2\times10^{17}$ atoms/cm$^3$. The same applies to the concentration of carbon in the oxide layer 510.

The oxide layer 510 includes a region where the concentration of alkali metal is lower than or equal to $1\times10^{18}$ atoms/cm$^3$, preferably lower than or equal to 2×10$^{16}$ atoms/cm$^3$. The same applies to the concentration of alkaline earth metal in the oxide layer 510.

The oxide layer 510 includes a region where the concentration of nitrogen is lower than 5×10$^{19}$ atoms/cm$^3$, preferably lower than or equal to 5×10$^{18}$ atoms/cm$^3$, further preferably lower than or equal to 1×10$^{18}$ atoms/cm$^3$, still further preferably lower than or equal to 5×10$^{17}$ atoms/cm$^3$.

The oxide layer 510 includes a region where the concentration of hydrogen is lower than 1×10$^{20}$ atoms/cm$^3$, preferably lower than 1×10$^{19}$ atoms/cm$^3$, further preferably lower than 5×10$^{18}$ atoms/cm$^3$, still further preferably lower than 1×10$^{18}$ atoms/cm$^3$.

The concentrations of the impurities in the oxide layer 510 are measured by SIMS.

In the case where the metal oxide layer 512 contains oxygen vacancies, donor levels are formed by entry of hydrogen into sites of oxygen vacancies in some cases. As a result, the on-state current of the OS transistor 501 is decreased. Sites of oxygen vacancies become more stable by entry of oxygen than by entry of hydrogen. Thus, by decreasing oxygen vacancies in metal oxide layer 512, the on-state current of the OS transistor 501 can be increased in some cases. Consequently, preventing entry of hydrogen into sites of oxygen vacancies by a reduction in hydrogen in the metal oxide layer 512 is effective in improving on-state current characteristics.

Hydrogen contained in a metal oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, the OS transistor 501 is likely to be normally-on when the metal oxide layer 512 contains hydrogen because the metal oxide layer 512 includes a channel formation region. Accordingly, it is preferable that hydrogen in the metal oxide layer 512 be reduced as much as possible.

FIGS. 20A to 20C illustrate examples in which the oxide layer 510 has a three-layer structure; however, one embodiment of the present invention is not limited thereto. For example, the oxide layer 510 may have a two-layer structure without the metal oxide layer 511 or 513. Alternatively, the oxide layer 510 may have a four-layer structure in which any one of the oxide semiconductor layers described as the metal oxide layers 511 to 513 is provided below or over the metal oxide layer 511 or below or over the metal oxide layer 513. Alternatively, the oxide layer 510 may include one or more metal oxide layers that are similar to the metal oxide layers 511 to 513 at two or more of the following positions: between given layers in the oxide layer 510, over the oxide layer 510, and below the oxide layer 510.

<Energy Band Structure>

Figure 27:
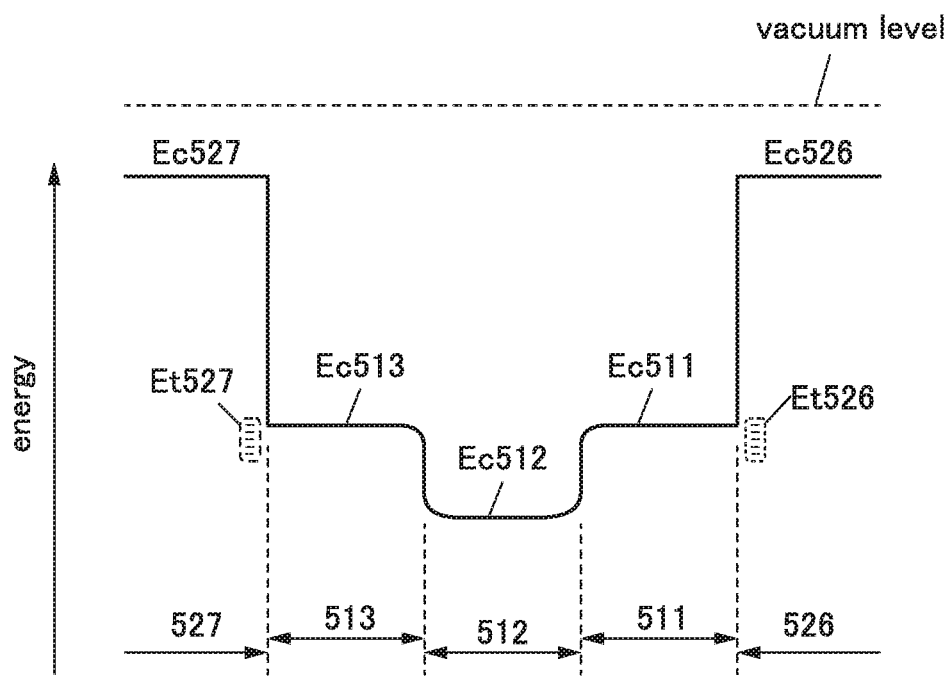
FIG. 27 is an energy band diagram of an OS transistor.

Effects of the stack of the metal oxide layers 511 to 513 are described with reference to FIG. 27. FIG. 27 is a schematic diagram showing the energy band structure of a channel formation region of the OS transistor 501. Although the OS transistor 501 is described here as an example, effects of the stack of the metal oxide layers 511 to 513 in the OS transistors 502 and 503 to be described later are similar to those in the OS transistor 501.

Here, Ec526, Ec511, Ec512, Ec513, and Ec527 indicate the energy at the bottom of the conduction band of the insulating layer 526, the metal oxide layer 511, the metal oxide layer 512, the metal oxide layer 513, and the insulating layer 527, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer (UT-300 manufactured by HORIBA JOBIN YVON S.A.S.). The difference in energy between the vacuum level and the top of the valence band can be measured using an ultraviolet photoelectron spectroscopy (UPS) device (VersaProbe manufactured by ULVAC-PHI, Inc.).

Since the insulating layers 526 and 527 are insulators, Ec526 and Ec527 are closer to the vacuum level than Ec511, Ec512, and Ec513 (i.e., the insulating layers 526 and 527 have a lower electron affinity than the metal oxide layers 511 to 513).

The metal oxide layer 512 has a higher electron affinity than the metal oxide layers 511 and 513. For example, the difference in electron affinity between the metal oxide layers 511 and 512 and the difference in electron affinity between the metal oxide layers 512 and 513 are each greater than or equal to 0.07 eV and less than or equal to 1.3 eV. The difference in electron affinity between the metal oxide layers 511 and 512 and the difference in electron affinity between the metal oxide layers 512 and 513 are each preferably greater than or equal to 0.1 eV and less than or equal to 0.7 eV, more preferably greater than or equal to 0.15 eV and less than or equal to 0.4 eV. Note that the electron affinity is a difference in energy between the vacuum level and the bottom of the conduction band.

When voltage is applied to the gate electrode (the conductive layer 550) of the OS transistor 501, a channel is mainly formed in the metal oxide layer 512 having the highest electron affinity among the metal oxide layers 511 to 513.

An indium gallium oxide has low electron affinity and a high oxygen-blocking property. Therefore, the metal oxide layer 513 preferably includes an indium gallium oxide. The gallium atomic ratio [Ga/(In+Ga)] is, for example, higher than or equal to 70%, preferably higher than or equal to 80%, more preferably higher than or equal to 90%.

In some cases, there is a mixed region of the metal oxide layers 511 and 512 between the metal oxide layers 511 and 512. Furthermore, in some cases, there is a mixed region of the metal oxide layers 512 and 513 between the metal oxide layers 512 and 513. Because the mixed region has low interface state density, a stack of the metal oxide layers 511 to 513 (the oxide layer 510) has a band structure where energy at each interface and in the vicinity of the interface is changed continuously (continuous junction).

Electrons transfer mainly through the metal oxide layer 512 in the oxide layer 510 having such an energy band structure. Therefore, even when an interface state exists at an interface between the metal oxide layer 511 and the insulating layer 526 or an interface between the metal oxide layer 513 and the insulating layer 527, electron movement in the oxide layer 510 is less likely to be inhibited and the on-state current of the OS transistor 501 can be increased.

Although trap states Et526 and Et527 due to impurities or defects might be formed in the vicinity of the interface between the metal oxide layer 511 and the insulating layer 526 and the vicinity of the interface between the metal oxide layer 513 and the insulating layer 527 as illustrated in FIG.

27, the metal oxide layer 512 can be separated from the trap states Et526 and Et527 owing to the existence of the metal oxide layers 511 and 513.

Note that when a difference in energy between Ec511 and Ec512 is small, an electron in the metal oxide layer 512 might reach the trap state Et526 by passing over the difference in energy. Since the electron is trapped at the trap state Et526, negative fixed charge is generated at the interface with the insulating film, causing the threshold voltage of the transistor to be shifted in a positive direction. The same applies to the case where a difference in energy between Ec511 and Ec513 is small.

Each of the difference in energy between Ec511 and Ec512 and the difference in energy between Ec512 and Ec513 is preferably greater than or equal to 0.1 eV, more preferably greater than or equal to 0.15 eV so that a change in the threshold voltage of the OS transistor 501 can be reduced and the OS transistor 501 can have favorable electrical characteristics.

<Configuration Example 2 of OS Transistor>

Figure 21A:
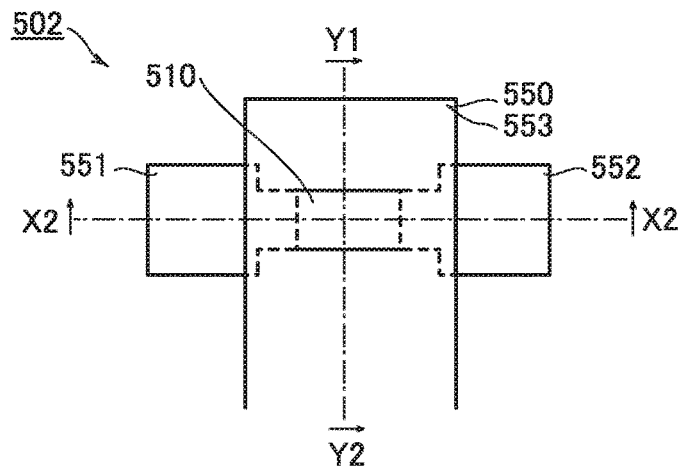
FIG. 21A is a plan view illustrating a configuration example of an OS transistor.
Figures 21B, 21C:
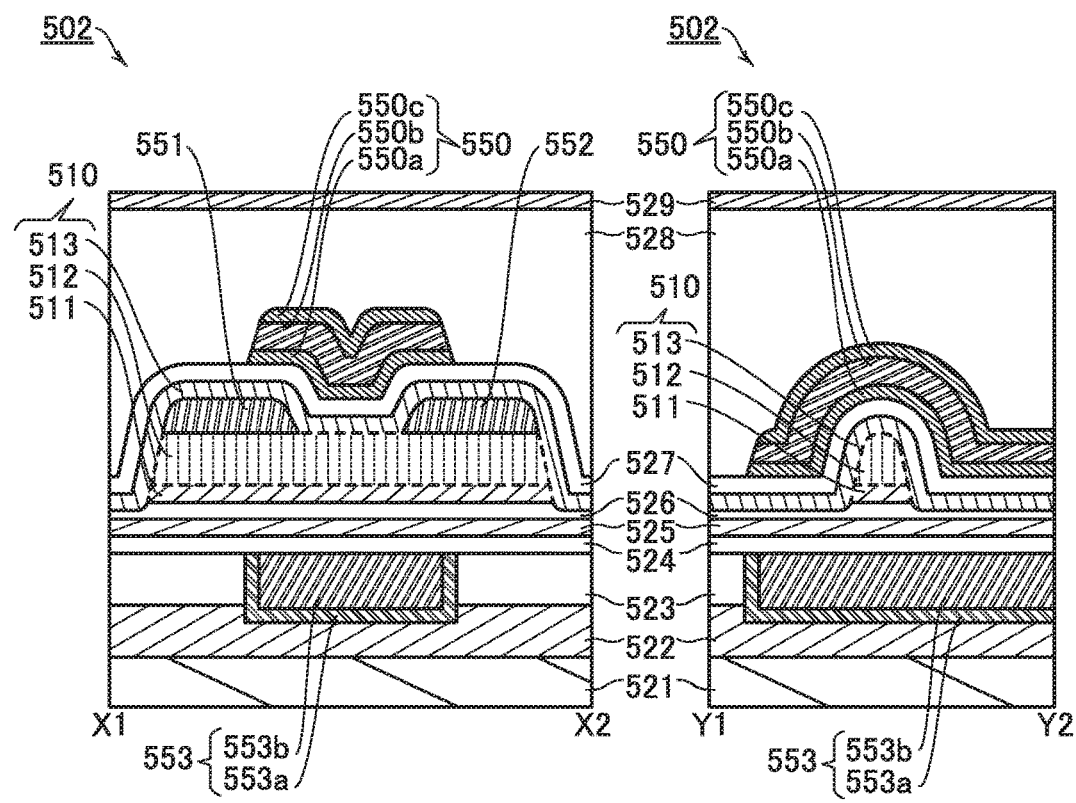
FIGS. 21B and 21C are cross-sectional views of the OS transistor in FIG. 21A.

The OS transistor 502 in FIGS. 21A to 21C is a modification example of the OS transistor 501. The conductive layer 550 of the OS transistor 502 includes a conductive layer 550a, a conductive layer 550b, and a conductive layer 550c.

The conductive layer 550a is preferably formed by thermal CVD, MOCVD, or ALD. In particular, the conductive layer 550a is preferably formed by an atomic layer deposition (ALD) method. When the conductive layer 550a is formed by ALD or the like, plasma damage to the insulating layer 527 can be reduced. In addition, the conductive layer 550a is preferably formed by ALD or the like because coverage thereof can be improved. Therefore, it is possible to provide the highly reliable OS transistor 502.

The conductive layer 550b is formed using a material that has high conductivity, such as tantalum, tungsten, copper, or aluminum. The conductive layer 550c formed over the conductive layer 550b is preferably formed using a conductor that is less likely to be oxidized, such as tungsten nitride. In the case where an oxide material from which oxygen is released is used for the insulating layer 528, the conductive layer 550 can be prevented from being oxidized by released oxygen. Thus, it is possible to suppress oxidation of the conductive layer 550 and efficiently supply oxygen released from the insulating layer 528 to the oxide layer 510.

When a conductor that is less likely to be oxidized is used for the conductive layer 550c having a large contact area with the insulating layer 528 including an excess oxygen region, it is possible to suppress absorption of excess oxygen in the insulating layer 528 by the conductive layer 550. In addition, when a conductor with high conductivity is used for the conductive layer 550b, it is possible to provide the OS transistor 502 with low power consumption.

<Configuration Example 3 of OS Transistor>

Figure 22A:
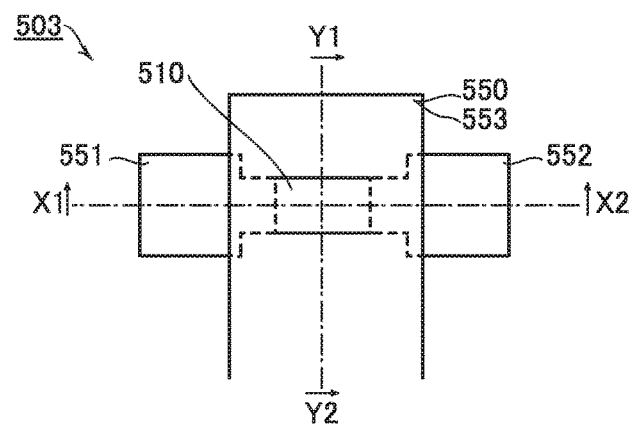
FIG. 22A is a plan view illustrating a configuration example of an OS transistor.
Figures 22B, 22C:
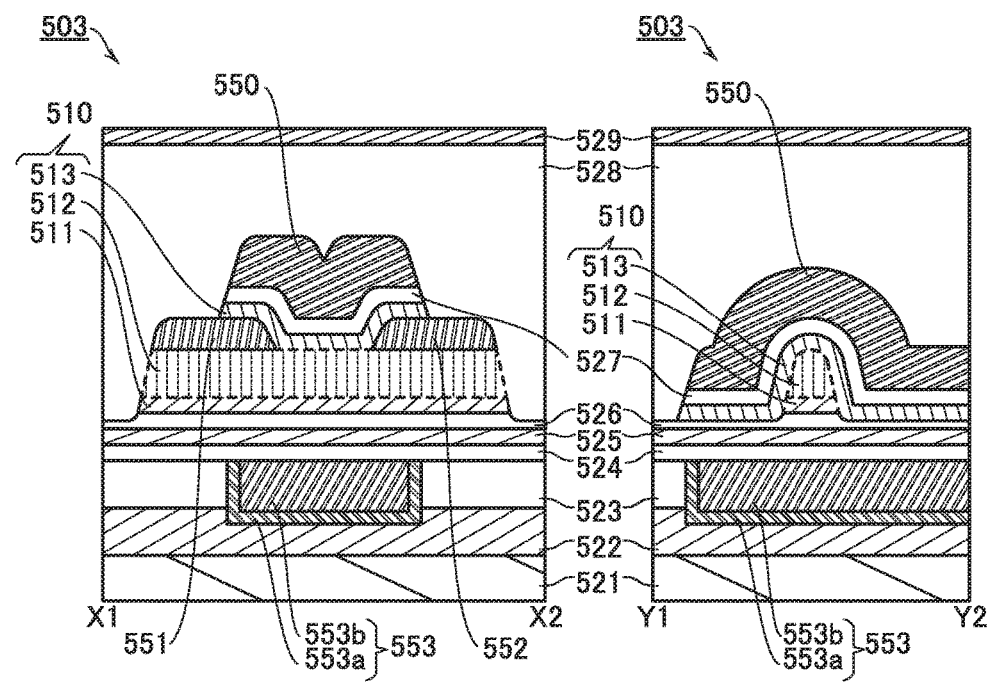
FIGS. 22B and 22C are cross-sectional views of the OS transistor in FIG. 22A.

The OS transistor 503 in FIGS. 22A to 22C is a modification example of the OS transistor 501. In the OS transistor 503, the conductive layer 550 is used as an etching mask to etch the metal oxide layer 513 and the insulating layer 527.

<Configuration Example 4 of OS Transistor>

The OS transistor 504 in FIGS. 23A to 23C is a modification example of the OS transistor 501.

The conductive layer 550 has a two-layer structure of the conductive layer 550a and the conductive layer 550b. The conductive layer 550 is covered with an insulating layer 530.

For example, the insulating layer 530 has an oxygen barrier property. Thus, oxygen released from the insulating layer 528 or the like can suppress oxidation of the conductive layer 550. In that case, a metal oxide such as aluminum oxide can be used for the insulating layer 530. The thickness of the insulating layer 530 is not limited to a certain thickness as long as oxidation of the conductive layer 550 can be prevented. For example, the thickness of the insulating layer 530 is greater than or equal to 1 nm and less than or equal to 10 nm, preferably greater than or equal to 3 nm and less than or equal to 7 nm.

Note that as in the case of the OS transistor 503, the metal oxide layer 513 and the insulating layer 527 in the OS transistor 504 may be partly removed so that upper surfaces of the conductive layers 551 and 552 are partly exposed. Alternatively, only the insulating layer 527 may be partly removed.

<Configuration Example 5 of OS Transistor>

The OS transistor 505 in FIGS. 24A to 24C is a modification example of the OS transistor 501.

The conductive layer 551 has a two-layer structure of a conductive layer 551a and a conductive layer 551b, and the conductive layer 552 has a two-layer structure of a conductive layer 552a and a conductive layer 552b.

In the conductive layers 551 and 552, the conductive layers 551a and 552a are preferably formed using a conductive film that has high adhesion to the metal oxide layer 512. This conductive film is preferably formed by ALD because coverage thereof can be improved. The conductive layers 551b and 552b are preferably formed using a conductor that has higher conductivity than the conductive layers 551a and 552a. The use of the conductive layers 551a and 552a reduces restrictions on a conductive material that can be used for the conductive layers 551b and 552b. When a material that has high conductivity, such as tantalum, tungsten, copper, or aluminum, is used for the conductive layers 551a and 552a, power consumption of a circuit including the OS transistor 505 can be reduced.

<Configuration Example 6 of OS Transistor>

The OS transistor 506 in FIGS. 25A to 25C is a modification example of the OS transistor 501. The OS transistor 506 differs from the OS transistor 501 mainly in the structure of the gate electrode.

The metal oxide layer 513, the insulating layer 527, and the conductive layer 550 are provided in an opening portion formed in the insulating layer 528. In other words, a gate electrode can be formed in a self-aligning manner by using the opening portion in the insulating layer 528. Thus, in the OS transistor 506, a gate electrode (550) does not include a region that overlaps with a source electrode and a drain electrode (551 and 552) with a gate insulating layer (527) positioned therebetween. Accordingly, gate-source parasitic capacitance and gate-drain parasitic capacitance can be reduced and frequency characteristics can be improved. Furthermore, gate electrode width can be controlled by the opening portion in the insulating layer 528; thus, it is easy to fabricate an OS transistor with short channel length.

<Configuration Example 7 of OS Transistor>

Figure 26A:
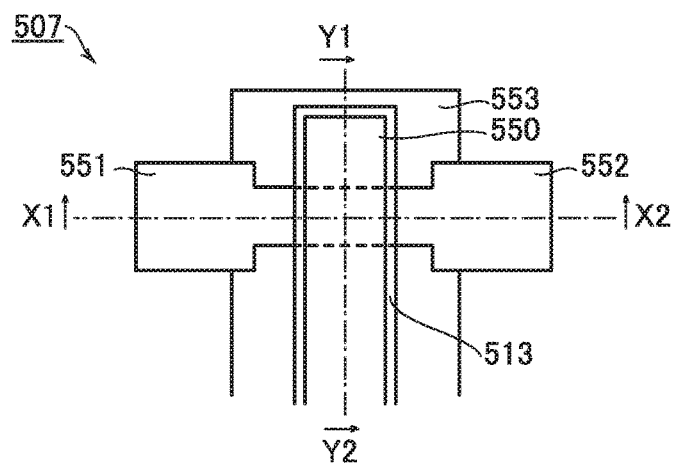
FIG. 26A is a plan view illustrating a configuration example of an OS transistor.
Figure 26B:
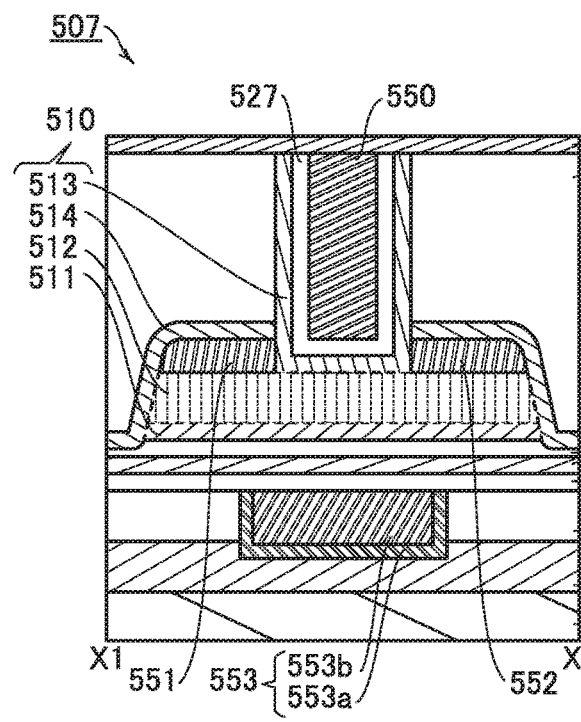
FIGS. 26B and 26C are cross-sectional views of the OS transistor in FIG. 26A.
Figure 26C:
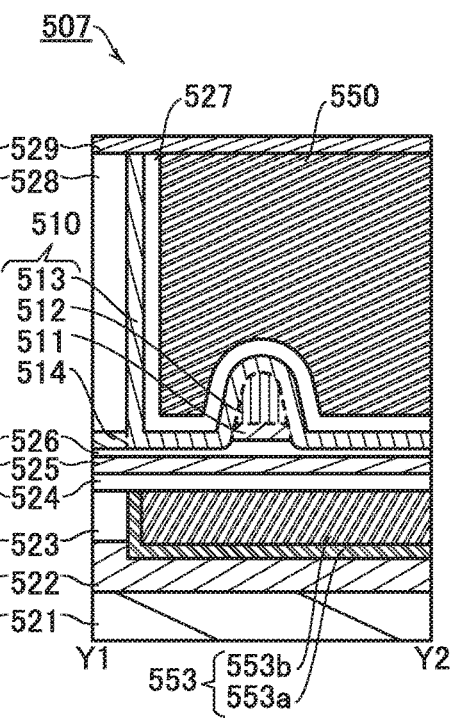

The OS transistor 507 in FIGS. 26A to 26C is a modification example of the OS transistor 506.

The oxide layer 510 further includes a metal oxide layer 514. The metal oxide layer 514 covers the metal oxide layers 511 and 512 and the conductive layers 551 and 552.

The metal oxide layer 512 is separated from the insulating layer 528 by the metal oxide layer 514. In the oxide layer 510, a channel is mainly formed in the metal oxide layer 512; thus, generation of a shallow level in the vicinity of the channel can be suppressed when there is no region where the metal oxide layer 512 is in contact with the insulating layer 528. Thus, reliability of the OS transistor 507 can be improved.

<Configuration Example of Semiconductor Device>

A configuration example of a semiconductor device including OS transistors and Si transistors is described with reference to FIG. 28.

Figure 28:
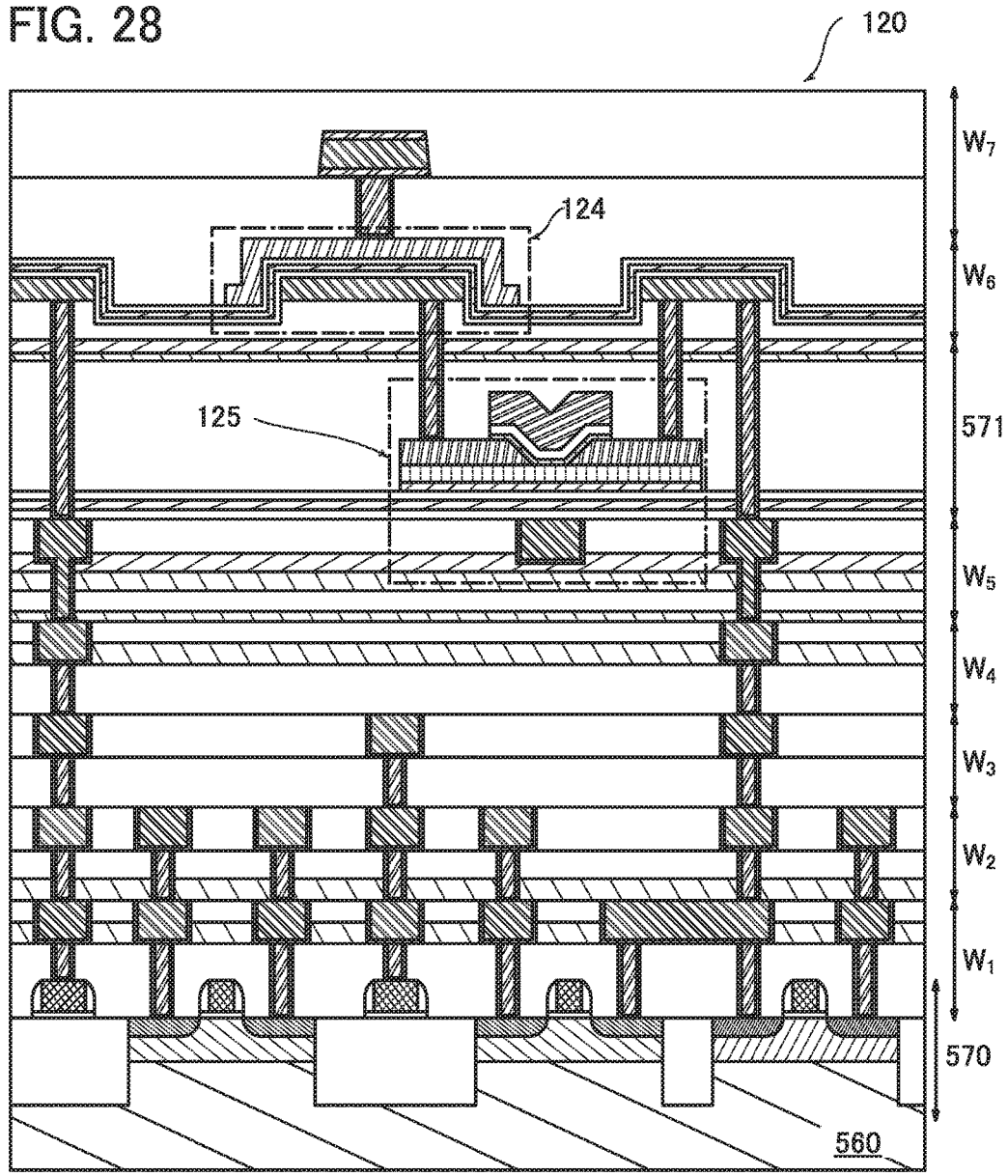
FIG. 28 is a cross-sectional view illustrating a configuration example of a stabilized power supply circuit.

FIG. 28 is a cross-sectional view for illustrating a stacked-layer structure of the stabilized power supply circuit 120 (FIG. 1).

The stabilized power supply circuit 120 includes a stack of a CMOS layer 570, wiring layers $W_1$ to $W_5$, an OSFET layer 571, and wiring layers $W_6$ and $W_7$.

Si transistors for forming the amplifier circuit 122 in the stabilized power supply circuit 120 are provided in the CMOS layer 570. An active layer of the Si transistor is formed using a single crystalline silicon wafer 560.

The transistor 125 included in the sample-and-hold circuit 121 is provided in the OSFET layer 571. In FIG. 28, the transistor 125 and the capacitor 124 in the sample-and-hold circuit 121 are typically illustrated. The back gate electrode of the transistor 125 is formed in the wiring layer $W_5$. The capacitor 124 in the sample-and-hold circuit 121 is provided in the wiring layer $W_6$. Note that the structure and method described in this embodiment can be implemented by being combined as appropriate with any of the other structures and methods described in the other embodiments.

Embodiment 10

In this embodiment, an oxide semiconductor is described. An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

(CAAC-OS)

A CAAC-OS is an oxide semiconductor having a plurality of c-axis aligned crystal parts (also referred to as pellets).

The CAAC-OS has c-axis alignment, its crystal parts (nanocrystals) are connected in an a-b plane direction, and the crystal structure has distortion. The size of the crystal part is greater than or equal to 1 nm, or greater than or equal to 3 nm. For this reason, the crystal part of the CAAC-OS can be referred to as a nanocrystal, and the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

The impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, oxygen vacancies in the oxide semiconductor serve as carrier traps or serve as carrier generation sources when hydrogen is captured therein.

(nc-OS)

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS. Thus, the orientation of the whole film is not observed. Since there is no regularity of crystal orientation between the crystal parts (nanocrystals), the nc-OS can also be referred to as an oxide semiconductor including random aligned nanocrystals (RANC) or an oxide semiconductor including non-aligned nanocrystals (NANC).

Since the crystal of the nc-OS does not have alignment, the nc-OS cannot be distinguished from an a-like OS or an amorphous oxide semiconductor in some cases depending on an analysis method.

The a-like OS has lower density than the nc-OS and the CAAC-OS. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor with an atomic ratio of In:Ga:Zn=1:1:1, the density of single-crystal $InGaZnO_4$ with a rhombohedral crystal structure is 6.357 g/cm$^3$. Thus, for example, in the case of the oxide semiconductor with an atomic ratio of In:Ga:Zn=1:1:1, the density of an a-like OS is higher than or equal to 5.0 g/cm$^3$ and lower than 5.9 g/cm$^3$. In addition, for example, in the case of the oxide semiconductor with an atomic ratio of In:Ga:Zn=1:1:1, the density of an nc-OS or a CAAC-OS is higher than or equal to 5.9 g/cm$^3$ and lower than 6.3 g/cm$^3$.

Note that in the case where single crystals with the same composition do not exist, by combining single crystals with different compositions at a given proportion, it is possible to estimate density that corresponds to the density of a single crystal with a desired composition. The density of the single crystal with a desired composition may be estimated using weighted average with respect to the combination ratio of the single crystals with different compositions. Note that it is preferable to combine as few kinds of single crystals as possible for density estimation.

As described above, oxide semiconductors have various structures and various properties. An oxide semiconductor may be a stacked film including two or more of an amorphous oxide semiconductor, an a-like OS, an nc-OS, and a CAAC-OS, for example. The structure of the oxide semiconductor can be identified by X-ray diffraction (XRD), nanobeam electron diffraction, observation with a transmission electron microscope (TEM), or the like.

<Carrier Density of Oxide Semiconductor>

Next, the carrier density of an oxide semiconductor is described. Examples of a factor affecting the carrier density of an oxide semiconductor include oxygen vacancy ($V_O$) and impurities in the oxide semiconductor.

As the amount of oxygen vacancy in the oxide semiconductor increases, the density of defect states increases when hydrogen is bonded to the oxygen vacancy (this state is also referred to as $V_OH$). The density of defect states also increases with an increase in the amount of impurity in the oxide semiconductor. Hence, the carrier density of an oxide semiconductor can be controlled by controlling the density of defect states in the oxide semiconductor.

The carrier density of the oxide semiconductor is preferably reduced in order to inhibit the negative shift of Vt of the OS transistor or reduce the off-state current of the OS transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state.

The carrier density of the oxide semiconductor is preferably increased in some cases in order to increase the on-state current or field-effect mobility of the OS transistor. The carrier density of the oxide semiconductor can be increased by slightly increasing the impurity concentration or the density of defect states in the oxide semiconductor. For example, an oxide semiconductor that has a slightly high impurity concentration or a slightly high density of defect states can be regarded as substantially intrinsic.

Furthermore, an oxide semiconductor that has a high electron affinity and thus has a narrow bandgap so as to increase the density of thermally excited electrons (carriers) can be regarded as substantially intrinsic. Note that an OS transistor using an oxide semiconductor with higher electron affinity has lower Vt.

The oxide semiconductor with an increased carrier density has somewhat n-type conductivity; thus, it can be referred to as a "slightly-n" oxide semiconductor.

The carrier density of a highly purified intrinsic oxide semiconductor is, for example, lower than $8\times10^{15}$ cm$^{-3}$, preferably lower than $1\times10^{11}$ cm$^{-3}$, more preferably lower than $1\times10^{10}$ cm$^{-3}$ and higher than or equal to $1\times10^{-9}$ cm$^{-3}$.

The carrier density of a substantially highly purified intrinsic oxide semiconductor is, for example, higher than or equal to $1\times10^{5}$ cm$^{-3}$ and lower than $1\times10^{18}$ cm$^{-3}$, preferably higher than or equal to $1\times10^{7}$ cm$^{-3}$ and lower than or equal to $1\times10^{17}$ cm$^{-3}$, more preferably higher than or equal to $1\times10^{9}$ cm$^{-3}$ and lower than or equal to $5\times10^{16}$ cm$^{-3}$, still more preferably higher than or equal to $1\times10^{10}$ cm$^{-3}$ and lower than or equal to $1\times10^{16}$ cm$^{-3}$, yet more preferably higher than or equal to $1\times10^{11}$ cm$^{-3}$ and lower than or equal to $1\times10^{15}$ cm$^{-3}$. Note that the structure and method described in this embodiment can be implemented by being combined as appropriate with any of the other structures and methods described in the other embodiments.

This application is based on Japanese Patent Application serial no. 2016-024925 filed with Japan Patent Office on Feb. 12, 2016, the entire contents of which are hereby incorporated by reference.

What is claimed is:

1. A semiconductor device comprising:
a power supply control circuit; and
a control circuit,
wherein the power supply control circuit comprises a reference voltage generating circuit and a stabilized power supply circuit,
wherein the stabilized power supply circuit comprises a first sample-and-hold circuit and a first amplifier circuit,
wherein the reference voltage generating circuit is configured to generate a first voltage applied to the first amplifier circuit,
wherein the first sample-and-hold circuit is electrically connected to an input terminal of the first amplifier circuit,
wherein the control circuit is configured to set a voltage of the first sample-and-hold circuit to a second voltage,
wherein the first amplifier circuit is configured to output a third voltage to an output terminal of the first amplifier circuit,
wherein the first sample-and-hold circuit comprises a first transistor whose on/off state is controlled by the control circuit, and
wherein the first transistor comprises an oxide semiconductor in a channel formation region.

2. The semiconductor device according to claim 1,
wherein the control circuit comprises a processor, a digital-analog converter circuit, and a decoder circuit,
wherein the decoder circuit is electrically connected to a gate of the first transistor,
wherein the digital-analog converter circuit is electrically connected to one of a source and a drain of the first transistor,
wherein the decoder circuit is configured to output a signal for controlling the on/off state of the first transistor in accordance with control of the processor, and
wherein the digital-analog converter circuit is configured to output the second voltage in accordance with control of the processor.

3. The semiconductor device according to claim 2,
wherein the reference voltage generating circuit is configured to apply the first voltage to the digital-analog converter circuit, and
wherein the processor is configured to stop the first voltage applied to the digital-analog converter circuit from the reference voltage generating circuit.

4. The semiconductor device according to claim 1,
wherein the stabilized power supply circuit comprises a second sample-and-hold circuit,
wherein the control circuit comprises an analog-digital converter circuit and a decoder circuit,
wherein the second sample-and-hold circuit comprises a second transistor whose on/off state is controlled by the decoder circuit, and wherein the second transistor comprises an oxide semiconductor in a channel formation region.

5. The semiconductor device according to claim 1,
wherein the reference voltage generating circuit comprises an antenna, and
wherein the reference voltage generating circuit is configured to generate the first voltage by any one of an electromagnetic coupling method, an electromagnetic induction method, and a radio wave method.

6. An electronic device comprising the semiconductor device according to claim 1 and at least one of a display portion, a touch sensor, a microphone, a speaker, an operation key, and a housing.

7. A semiconductor wafer comprising:
a plurality of first regions; and
a region for dicing,
wherein the semiconductor device according to claim 1 is provided in each of the plurality of first regions.

8. A semiconductor device comprising:
a power supply control circuit; and
a control circuit comprising an analog-digital converter circuit,
wherein the power supply control circuit comprises a reference voltage generating circuit and a stabilized power supply circuit,
wherein the stabilized power supply circuit comprises a first sample-and-hold circuit and a first amplifier circuit,
wherein the reference voltage generating circuit is configured to generate a first voltage applied to the first amplifier circuit,
wherein the first sample-and-hold circuit is electrically connected to an input terminal of the first amplifier circuit,
wherein the control circuit is configured to set a voltage of the first sample-and-hold circuit to a second voltage,
wherein the first amplifier circuit is configured to output a third voltage to an output terminal of the first amplifier circuit,
wherein the first sample-and-hold circuit comprises a first transistor whose on/off state is controlled by the control circuit,
wherein the first transistor comprises an oxide semiconductor in a channel formation region,
wherein the stabilized power supply circuit comprises a switching circuit,
wherein the switching circuit comprises an input-output terminal,
wherein the switching circuit comprises a first switch and a second switch,
wherein one of terminals of the first switch is electrically connected to the output terminal of the first amplifier circuit,
wherein one of terminals of the second switch is electrically connected to the analog-digital converter circuit,
wherein the other of the terminals of the first switch is electrically connected to the input-output terminal,
wherein the other of the terminals of the second switch is electrically connected to the input-output terminal,
wherein the switching circuit is configured to switch a first function, a second function, and a third function,
wherein the first function is to apply the third voltage to the input-output terminal by turning on the first switch,
wherein the second function is to apply the third voltage to the analog-digital converter circuit through the input-output terminal by turning on the first switch and the second switch, and
wherein the third function is to turn on the first switch and the second switch exclusively, to output the third voltage when the first switch is in an on state and the second switch is in an off state, and to monitor a fourth voltage applied to the input-output terminal when the first switch is in an off state and the second switch is in an on state.

9. The semiconductor device according to claim 8,
wherein the control circuit comprises a processor, a digital-analog converter circuit, and a decoder circuit,
wherein the decoder circuit is electrically connected to a gate of the first transistor,
wherein the digital-analog converter circuit is electrically connected to one of a source and a drain of the first transistor,
wherein the decoder circuit is configured to output a signal for controlling the on/off state of the first transistor in accordance with control of the processor, and
wherein the digital-analog converter circuit is configured to output the second voltage in accordance with control of the processor.

10. The semiconductor device according to claim 9,
wherein the reference voltage generating circuit is configured to apply the first voltage to the digital-analog converter circuit, and
wherein the processor is configured to stop the first voltage applied to the digital-analog converter circuit from the reference voltage generating circuit.

11. The semiconductor device according to claim 8,
wherein the stabilized power supply circuit comprises a second sample-and-hold circuit,
wherein the control circuit comprises a decoder circuit,
wherein the second sample-and-hold circuit comprises a second transistor whose on/off state is controlled by the decoder circuit, and
wherein the second transistor comprises an oxide semiconductor in a channel formation region.

12. The semiconductor device according to claim 8,
wherein the reference voltage generating circuit comprises an antenna, and
wherein the reference voltage generating circuit is configured to generate the first voltage by any one of an electromagnetic coupling method, an electromagnetic induction method, and a radio wave method.

13. An electronic device comprising the semiconductor device according to claim 8 and at least one of a display portion, a touch sensor, a microphone, a speaker, an operation key, and a housing.

14. A semiconductor wafer comprising:
a plurality of first regions; and
a region for dicing,
wherein the semiconductor device according to claim 8 is provided in each of the plurality of first regions.

* * * * *